(12) United States Patent
Dussarrat et al.

(10) Patent No.: US 12,404,585 B2
(45) Date of Patent: Sep. 2, 2025

(54) LITHIUM PRECURSORS FOR DEPOSITION OF LITHIUM-CONTAINING LAYERS, ISLETS OR CLUSTERS

(71) Applicant: L'Air Liquide, Société Anonyme pour l'Etude et l'Exploitation des Procédés Georges Claude, Paris (FR)

(72) Inventors: Christian Dussarrat, Yokosuka (JP); Keishi Yamamoto, Yokosuka (JP); Nicolas Blasco, Paris (FR); Sunao Kamimura, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 17/767,771

(22) PCT Filed: Oct. 8, 2020

(86) PCT No.: PCT/US2020/054720
§ 371 (c)(1),
(2) Date: Apr. 8, 2022

(87) PCT Pub. No.: WO2021/072036
PCT Pub. Date: Apr. 15, 2021

(65) Prior Publication Data
US 2024/0102161 A1 Mar. 28, 2024

Related U.S. Application Data

(60) Provisional application No. 62/915,263, filed on Oct. 15, 2019, provisional application No. 62/912,458, filed on Oct. 8, 2019.

(51) Int. Cl.
C23C 16/455 (2006.01)
C07F 1/02 (2006.01)
(Continued)

(52) U.S. Cl.
CPC ......... *C23C 16/45553* (2013.01); *C07F 1/02* (2013.01); *C23C 16/30* (2013.01);
(Continued)

(58) Field of Classification Search
CPC ............ C23C 16/30; C23C 16/45531; C23C 16/45553; C23C 16/45555; C07F 1/02; H01M 4/31; H01M 4/5825
(Continued)

(56) References Cited

U.S. PATENT DOCUMENTS 3,911,176 A * 10/1975 Curtis ................. C23C 16/409
427/377
6,294,495 B1 9/2001 Matsunaga
(Continued)

FOREIGN PATENT DOCUMENTS

| CN | 106537657 | 3/2017 | | |
|---|---|---|---|---|
| EP | 0574807 A1 * | 12/1993 | ............ | C30B 29/30 |

(Continued)

OTHER PUBLICATIONS

Aaltonen, T. et al., Lanthanum titanate and lithium lanthanum titanate films grown by atomic layer deposition, J. Mater. Chem., 2010, 20(14), 2877-2881, no month available.
(Continued)

*Primary Examiner* — Brian K Talbot
(74) *Attorney, Agent, or Firm* — Yan Jiang

(57) ABSTRACT

Methods for forming a Li-containing film, islet or cluster on a substrate comprise the steps of introducing a vapor of a silicon-free lithium precursor into a reactor and depositing at least part of the silicon-free lithium precursor onto the substrate to form the Li-containing film, islet or cluster using a vapor deposition method.

12 Claims, 10 Drawing Sheets

(51) Int. Cl.
*C23C 16/30* (2006.01)
*H01M 4/131* (2010.01)
*H01M 4/58* (2010.01)

(52) U.S. Cl.
CPC .. *C23C 16/45531* (2013.01); *C23C 16/45555* (2013.01); *H01M 4/131* (2013.01); *H01M 4/5825* (2013.01)

(58) Field of Classification Search
USPC ...................................................... 427/126.1
See application file for complete search history.

(56) References Cited

U.S. PATENT DOCUMENTS

| | | | |
|---|---|---|---|
| 6,960,675 B2 * | 11/2005 | Chen | C23C 16/40 556/42 |
| 7,439,338 B2 * | 10/2008 | Millward | H01L 21/28556 534/15 |
| 7,615,250 B2 | 11/2009 | Peters et al. | |
| 8,871,304 B2 | 10/2014 | Fujimura et al. | |
| 9,653,733 B2 * | 5/2017 | Hochgatterer | H01M 4/525 |
| 2008/0254218 A1 * | 10/2008 | Lei | C23C 16/18 427/248.1 |
| 2012/0145953 A1 * | 6/2012 | Pallem | C23C 16/45531 252/182.1 |
| 2012/0276305 A1 | 11/2012 | Hamalainen et al. | |
| 2013/0260024 A1 * | 10/2013 | Jodin | C23C 16/40 427/126.1 |
| 2014/0255798 A1 * | 9/2014 | Amine | H01M 4/9016 429/405 |
| 2016/0369397 A1 * | 12/2016 | Mäntymäki | C23C 16/30 |
| 2017/0005358 A1 * | 1/2017 | Nakai | C03C 17/22 |
| 2017/0067161 A1 * | 3/2017 | Shindo | H01M 10/0525 |
| 2018/0175375 A1 | 6/2018 | Lecuyer et al. | |
| 2019/0148766 A1 * | 5/2019 | Antonopoulos | H01M 10/0567 429/231.95 |
| 2020/0274161 A1 * | 8/2020 | Michot | H01M 4/587 |
| 2022/0231268 A1 * | 7/2022 | Dussarrat | C07F 9/5045 |

FOREIGN PATENT DOCUMENTS

| | | |
|---|---|---|
| WO | WO 00 67300 | 11/2000 |
| WO | WO 02 27063 | 4/2002 |
| WO | WO 2004 011692 | 2/2004 |
| WO | WO 2009 087609 | 7/2009 |
| WO | WO-2009084966 A1 * | 7/2009 ........... C23C 16/409 |
| WO | WO 2011 002920 | 1/2011 |
| WO | WO 2012 076817 | 6/2012 |

OTHER PUBLICATIONS

Al-Soudani, A.R.H. et al., Niobium complexes with terdentate diphosphino- and diamino-amido ligands. Crystal structure of [{NbCl$_3$[N(CH$_2$CH$_2$PMe$_2$)$_2$]}$_2$]•C$_6$H$_5$Me, J. Chem. Soc. Dalton Trans. 1995, 355-361, no month available.

The Group 13 Metals Aluminium, Gallium, Indium and Thallium: Chemical Patterns and Peculiarities, S. Aldridge and A.J. Downs, editors, Wiley Publishers, Hoboken, NJ, Apr. 2011, 533.

Mishra, S. et al., Metal-organic derivatives with fluorinated ligands as precursors for inorganic nanomaterials, Chemical Reviews, 2015, 115, 8379-8448.

Nisula, M. et al., Atomic layer deposition of lithium phosphorus oxynitride, Chem. Mater. 2015, 27, 6987-6993, no month available.

Nisula, M. et al., Atomic/molecular layer deposition of lithium terephthalate films as high rate capability li-ion battery anodes, Nano Lett., 2016, 16(2), 1276-1281, no month available.

Ostreng, E. et al., Atomic layer deposition of lithium nitride and carbonate using lithium silylamide, RSC Advances, 2012, 2, 6315-6322, no month available.

Putkonen, M. et al., Atomic layer deposition of lithium containing thin films, J. Mater. Chem. 2009, 19, 8767-8771, no month available.

Raston, C.L. et al., Lewis-base adducts of main Group I metal compounds. Part 2. Syntheses and structures of [Li$_4$Cl$_4$(pmdien)$_3$] and [LiI(pmdien)], J. Chem. Soc. Dalton Trans. 1998, 987-990, no month available.

Roschangar, F. et al., Use of lithium N,O-dimethylhydroxylamide as an efficient in situ protecting agent for aromatic aldehydes, Tetrahedron, 2002, 58(9), 1657-1666, no month availabl.

Ruud, A. et al., Enhanced process and composition control for atomic layer deposition with lithium trimethylsilanolate, Journal of Vacuum Science & Technology, A, Vacuum, Surfaces, and Films, 2017, 35(1), 01B133/1-01B133/8, no month available.

Su, C. et al., Isomerization of allyl ethers initiated by lithium diisopropylamide, Org. Lett., 2010, 12(23), 5378-5381, no month available.

Van Vliet, G.L. et al., X-ray crystal structures and some solution structures of lithium amides with intramolecular complexation of lithium, Chem. Eur. J., 1999, 5(3), 1091-1094, no month available.

International Search Report and Written Opinion for corresponding PCT/US2020/054720, Feb. 21, 2021.

* cited by examiner

LITHIUM PRECURSORS FOR DEPOSITION OF LITHIUM-CONTAINING LAYERS, ISLETS OR CLUSTERS

CROSS REFERENCE TO RELATED APPLICATIONS

The present application is a 371 of International Application No. PCT/US2020/054720, filed Oct. 8, 2020, which claims the benefit of U.S. Application No. 62/912,458, filed Oct. 8, 2019, and U.S. Application No. 62/915,263, filed Oct. 15, 2019, being incorporated herein by reference in their entireties for all purposes.

TECHNICAL FIELD

Disclosed are silicon-free lithium precursors for depositing a lithium-containing film, islet or cluster, and methods of synthesizing the same and methods of using the same, in particular, the disclosed precursors exhibit good volatility and thermal stability. The disclosed precursors are liquid below 150° C., preferably liquid at 50° C., more preferably liquid at 25° C., which is suitable for deposition techniques such as ALD and CVD applications.

BACKGROUND

Li-containing films are well-known for their applications to form surface coating layers or films of electrode materials in lithium-ion battery applications. Examples of Li-containing films include LiPON, lithium phosphate, lithium borate, lithium borophosphate, lithium niobate, lithium titanate, lithium zirconium oxides, etc. The absence of silicon, or the presence of silicon in a small amount, is preferred for the formation of some of these materials, especially lithium niobate, lithium titanate, lithium zirconate, or the like. During the first cycles of a lithium-ion battery, the formation of a solid electrolyte interface (SEI) on the anode and/or on the cathode are observed from the decomposition of the electrolyte at the electrolyte/electrode interfaces. A loss of capacity of the lithium-ion battery results from the consumption of lithium ion. In addition, the formed SEI layers are not uniform and unstable, so that cracks and dendrites may occur and lead to thermal runaway. Furthermore, the formed SEI layers also create a barrier potential that makes the intercalation in an electrode more difficult. The surface coating of electrodes by atomic layer deposition (ALD) and chemical vapor deposition (CVD) techniques has been used to form an intended SEI film, hence avoiding the formation of these unstable layers. Li-containing films are highly promising candidates as protective electrode coatings due to their good conductivity and high electrochemical stability. Another important application of Li-containing films is the formation of solid electrolyte materials used in solid-state batteries. Solid-state batteries are solvent-free systems having longer lifetime, faster charger time and higher energy density than conventional lithium-ion batteries. They are considered as the next technology step in battery development. Lithium-containing film solid electrolytes such as lithium phosphate, lithium borate and lithium borophosphate are deposited by ALD/CVD techniques. Uniform and conformal Li-containing films may even be obtained on complex architecture like 3D batteries.

With the raising energy storage needs, higher capacity retention together with improved safety performances is demanded. Li-containing films may effectively prevent or reduce the formation of Solid Electrolyte Interphase (SEI), such as lithium phosphate, lithium phosphorus oxynitride (LiPON), and different lithium metal oxides such lithium titanates, lithium zirconates and lithium niobates. These materials are expected to improve the interfaces between electrodes and electrolyte, either in current lithium ion batteries or solid state batteries. Li-containing films such as lithium niobate may also be used for high frequency electronic devices, for example, mobile applications. Lithium fluorite is also an interesting materials for optical or as a potential gate dielectric owing to high band-gap and high dielectric constant.

WO 00/67300 A1 to Gordon, et al. discloses synthesis of alkali lithium amides precursors with the general formula: $MN(E^1R^1R^2R^3)(E^2R^4R^5R^5)$, wherein M is an alkali metal: Li, Na, K; $E^1$ and $E^2$=C, Si, Ge or Sn; $R^1$, $R^2$, $R^3$, $R^4$, $R^5$, $R^6$ are H, alkyl groups or fluoroalkyl groups. All the compounds are liquid at 20° C. Formation of films containing alkali metals by CVD is disclosed.

WO 02/27063 A2 to Gordon, et al. discloses CVD and ALD of lithium phosphate using $LiN(SiMe_3)_2$, $LiN(SiEtMe_2)_2$ and Li(TMPD) as lithium precursor. Diisopropylphosphate was used as phosphate precursor. TMPD stands for 2,2,6,6-tetramethylpiperidide.

WO 2011/002920 A2 to Pallem, et al. discloses silicon-free Lithium-containing precursors, that is lithium alkyl amidinate and lithium alkylcyclopentadienyl compounds having a general formulas: $Li(R^1R^2R^3R^4R^5Cp).D$, $Li(NR-amd).D$ and $Li(NR-fmd).D$, where D=monodentate, bidentate, tridentate, or polydentate neutral coordinating ligand system; R, $R^1$, $R^2$, $R^3$, $R^4$, $R^5$, $R^6$ are H or alkyl groups.

US 2012/0276305 to Hamalainen, et al. discloses the syntheses of $LiN(SiMe_3)_2$, LiOtBu, Li(thd) and Li(hfac) from commercial sources. They are used as lithium sources for the formation of lithium phosphate films by ALD. Phosphorus sources disclosed are phosphate reagents with the formula $O=P(OR)_3$ where R is an alkyl group. In the examples, $LiN(SiMe_3)_2$ and LiOtBu are used in combination with trimethylphosphate (TMPO) for ALD of lithium phosphate. Li(thd) and Li(hfac) are also disclosed for $Li_2O$, $Li_2CO_3$ and other lithium-containing materials. All the lithium precursors disclosed by Hamalainen, et al. are solid, with high melting points (typically above 150° C.) with limited volatility and thermal stability.

More prior art for formation of Li-containing films may include Chem. Mater., 6987-6993, 27(20), 2015 (ALD of Lithium Phosphorus Oxynitride); Nano Lett., 1276-1281, 16(2), 2016 (Atomic/Molecular Layer Deposition of Lithium Terephthalate Films as High Rate Capability Li-Ion Battery Anodes); US 20170067161 (Method for producing lithium phosphorus oxynitride layer); Journal of Vacuum Science & Technology, A; Vacuum, Surfaces, and Films, 01B133/1-01B133/8, 35(1), 2017 (Enhanced process and composition control for atomic layer deposition with lithium trimethylsilanolate); RSC Advances, 6315-6322, 2(15), 2012 (ALD of lithium nitride and carbonate using lithium silylamide); WO 2012076817 (Method for producing lithium-based layers by CVD); J. Mater. Chem., 8767-8771, 19(46), 2009 (ALD of Lithium-containing thin films); U.S. Pat. No. 7,615,250 (Organoaluminum precursor compounds); U.S. Pat. No. 8,871,304 (Amide amino alkane) metal compound, method of manufacturing metal-containing thin film using said metal compound); Chem. Eur. J., 1091-1094, 5(3), 1999 (X-ray Crystal Structures and Some Solution Structures of Lithium Amides with Intramolecular Complexation of Lithium); U.S. Pat. No. 6,294,495 (Tridentate ligand-containing metal catalyst complexes for olefin polymerization); Org. Lett., 5378-5381, 12(23), 2010

(Isomerization of Allyl Ethers Initiated by Lithium Diisopropylamide); Tetrahedron 1657-1666, 58(9), 2002 (Use of lithium N,O-dimethylhydroxylamide as an efficient in situ protecting agent for aromatic aldehydes); J. Mater. Chem., 2877-2881, 20(14), 2010 (Lanthanum titanate and lithium lanthanum titanate films grown by atomic layer deposition).

Other applications of interest for the use of lithium precursors include the formation of Li-containing clusters or islets.

Lithium precursors containing silicon may commonly be used, such as $LiN(SiMe_3)_2$. Although this solid precursor is quite stable and sufficiently volatile, silicon would remain in part in the resulting deposited film. The presence of silicon may be a problem when forming materials such as $LiTiO_3$, $LiNbO_3$ or $LiZrO_x$, in which silicon may lead to adverse electrochemical features, linked to the induced disorder of the material, and hence lower ionic conductivity. Thus, there are needs to discover silicon-free lithium precursors for deposition applications.

SUMMARY

Disclosed are methods for forming a Li-containing film, islet or cluster on a substrate, the method comprising the steps of:
introducing a lithium precursor having a general formula:

$$[Li-NL^1L^2-D_x]_y \quad (I)$$

into a reactor containing the substrate disposed therein, wherein
- $L^1$ has a general formula: $C_mH_n$, $(C_mH_n)$-$ER^1R^2$ or $(C_mH_n)$-$E'R^1$, wherein
  - $C_mH_n$ is a linear, branched or cyclic alkyl groups;
  - m and n are independent integers, $1 \leq m \leq 16$, $1 \leq n \leq 16$;
  - E is B, N;
  - E' is a divalent element;
  - $R^1$ and $R^2$ each are independently selected from the group consisting of linear, branched or cyclic alkyl groups, or linear, branched or cyclic alkyl groups substituted by other atoms or groups;
- $L^2$ has a general formula: $(C_pH_q)$-$ER^3R^4$ or $(C_pH_q)$-$E'R^3$, wherein
  - $C_pH_q$ is a linear, branched or cyclic alkyl groups;
  - p and q are independent integers, $1 \leq p \leq 16$, $1 \leq q \leq 16$;
  - E is B, N;
  - E' is a divalent element;
  - $R^3$ and $R^4$ each are independently selected from the group consisting of linear, branched or cyclic alkyl groups, or linear, branched or cyclic alkyl groups substituted by other atoms or groups;
- D is independently selected from monodentate, bidentate, tridentate, or polydentate neutral coordinating ligand system;
- x is an integer, $0 \leq x \leq 4$; and
- y is the degree of association of the molecule, $1 \leq y \leq 6$; and
depositing at least part of the lithium precursor onto the substrate to form the Li-containing film, islet or cluster using a vapor deposition method.

The disclosed methods may include one or more of the following aspects:
- $L^1$ is a $C_1$-$C_{16}$ linear, branched or cyclic carbon chains, or of the form $(C_mH_n)$-$ER^1R^2$ or $(C_mH_n)$-$E'R^1$, wherein
  - $C_mH_n$ is an alkyl chain and may be linear, branched or cyclic alkyl groups;
  - E represents B, N;
  - E' represents a divalent element such as O, S;
- m is an integer which value is 1 or an integer ranging from 1 to 8;
- n is an independent integer ranging from 2 to 16;
- $R^1$ is independent and selected from the group consisting of hydrogen, linear, branched or cyclic $C_1$-$C_8$ alkyl groups, or linear, branched or cyclic alkyl groups substituted by other atoms or groups;
- $R^2$ is independent and selected from the group consisting of hydrogen, linear, branched or cyclic $C_1$-$C_8$ alkyl groups, or linear, branched or cyclic alkyl groups substituted by other atoms or groups;
- $L^2$ is of the form $(C_pH_q)$-$ER^3R^4$ or $(C_pH_q)$-$E'R^3$, wherein
  - $C_pH_q$ is an alkyl chain and may be linear, branched or cyclic alkyl groups;
  - E represents B, N;
  - E' represents a divalent element such as O, S;
- p and q are independent integers ranging from 1 to 16, preferably p is comprised from 1 to 8 and q is comprised from 2 to 16, most preferably p is different from m;
- $R^3$ and $R^4$ are independent and selected from the group consisting of hydrogen, linear, branched or cyclic alkyl groups, or linear, branched or cyclic alkyl groups substituted by other atoms or groups;
- D is independently selected from monodentate, bidentate, tridentate, or polydentate neutral coordinating ligand system. Preferably a monodentate or a bidentate;
- x is an integer comprised between 0 and 4;
- y represents the degree of association of the molecule and is comprised between 1 and 6;
- the lithium precursor being silicon-free;
- the lithium precursor being selected from LiNMe ($CH_2CH_2NMe_2$), LiNMe($CH_2CH_2NMe_2$)(1,2-diethoxyethane), LiNMe($CH_2CH_2NMe_2$)(1,2-dimethoxyethane), LiNEt($CH_2CH_2NMe_2$), LiNiPr ($CH_2CH_2NMe_2$), LiNtBu($CH_2CH_2NMe_2$), LiNtBu ($CH_2CH_2NEtMe$), LiNtBu($CHMeCH_2NMe_2$), LiNtBu ($CH_2CHMeNMe_2$), LiN($CH_2CH_2NMe_2$)$_2$, LiN ($CH_2CH_2NEt_2$)$_2$, LiN($CH_2CH_2NiPr_2$)$_2$, LiN ($CH_2CH_2NEtMe$)$_2$, LiN($CH_2CH_2CH_2NMe_2$)$_2$, LiN ($CHMeCH_2NMe_2$)$_2$, LiN($CHMeCH_2NMe_2$) ($CH_2CH_2NMe_2$), LiN($CH_2CHMeNMe_2$)$_2$, LiN ($CH_2CHMeNMe_2$)($CH_2CH_2NMe_2$), LiN ($CHEtCH_2NMe_2$)($CH_2CH_2NMe_2$), LiN ($CH_2CHEtNMe_2$)($CH_2CH_2NMe_2$), LiN ($CMe_2CH_2NMe_2$)($CH_2CH_2NMe_2$), LiN ($CH_2CMe_2NMe_2$)($CH_2CH_2NMe_2$), LiN ($CH_2CH_2NMe_2$)($CH_2CH_2CH_2NMe_2$), LiNMe ($CH_2CH_2OMe$), LiNMe($CH_2CH_2OEt$), LiNMe ($CH_2CH_2OiPr$) LiNMe($CH_2CH_2OtBu$), LiNEt ($CH_2CH_2OMe$), LiNEt($CH_2CH_2OEt$), LiNiPr ($CH_2CH_2OMe$), LiNtBu($CH_2CH_2OMe$), LiN ($CH_2CH_2OMe$)$_2$, LiN($CH_2CH_2OEt$)$_2$, LiN ($CH_2CH_2OiPr$)$_2$, LiN($CH_2CH_2OtBu$)$_2$, LiN ($CH_2CH_2NMe_2$)($CH_2CH_2OMe$), LiN($CH_2CH_2NMe_2$) ($CH_2CH_2OEt$), LiN($CH_2CH_2NMe_2$)($CH_2CH_2OiPr$), LiN($CH_2CH_2NMe_2$)($CH_2CH_2OtBu$), LiNMe($CH_2CH$ ($OMe$)$_2$), or the like;
- the lithium precursor being LiNtBu($CH_2CH_2NMe_2$), LiNtBu($CH_2CH_2NEtMe$), LiNtBu($CHMeCH_2NMe_2$), LiNtBu($CH_2CHMeNMe_2$), LiN($CH_2CH_2NEtMe$)$_2$, LiN($CH_2CH_2OEt$)$_2$, LiN($CH_2CH_2NMe_2$)$_2$, LiN ($CH_2CH_2NMe_2$)$_2$, LiN($CH_2CH_2NMeEt$)$_2$, LiN ($CHMeCH_2NMe_2$)($CH_2CH_2NMe_2$), LiN ($CH_2CHMeNMe_2$)($CH_2CH_2NMe_2$), LiN ($CHEtCH_2NMe_2$)($CH_2CH_2NMe_2$), LiN (CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NiPr$_2$)$_2$, LiN(CH$_2$CH$_2$NMe$_2$)(CH$_2$CH$_2$CH$_2$NMe$_2$), LiN(CH$_2$CH$_2$OEt)$_2$, LiNMe(CH$_2$CH$_2$OEt), LiNMe(CH$_2$CH(OMe)$_2$) or the like;
the lithium precursor being LiNMe(CH$_2$CH$_2$NMe$_2$);
the lithium precursor being LiNMe(CH$_2$CH$_2$NMe$_2$)(1;2-diethoxyethane);
the lithium precursor being LiNMe(CH$_2$CH$_2$NMe$_2$)(1;2-dimethoxyethane);
the lithium precursor being LiNEt(CH$_2$CH$_2$NMe$_2$);
the lithium precursor being LiNiPr(CH$_2$CH$_2$NMe$_2$);
the lithium precursor being LiNtBu(CH$_2$CH$_2$NMe$_2$);
the lithium precursor being LiNtBu(CH$_2$CH$_2$NEtMe);
the lithium precursor being LiNtBu(CHMeCH$_2$NMe$_2$);
the lithium precursor being LiNtBu(CH$_2$CHMeNMe$_2$);
the lithium precursor being LiN(CH$_2$CH$_2$NMe$_2$)$_2$;
the lithium precursor being LiN(CH$_2$CH$_2$NEt$_2$)$_2$;
the lithium precursor being LiN(CH$_2$CH$_2$NiPr$_2$)$_2$;
the lithium precursor being LiN(CH$_2$CH$_2$NEtMe)$_2$;
the lithium precursor being LiN(CH$_2$CH$_2$CH$_2$NMe$_2$)$_2$;
the lithium precursor being LiN(CHMeCH$_2$NMe$_2$)$_2$;
the lithium precursor being LiN(CHMeCH$_2$NMe$_2$)(CH$_2$CH$_2$NMe$_2$);
the lithium precursor being LiN(CH$_2$CHMeNMe$_2$)$_2$;
the lithium precursor being LiN(CH$_2$CHMeNMe$_2$)(CH$_2$CH$_2$NMe$_2$);
the lithium precursor being LiN(CHEtCH$_2$NMe$_2$)(CH$_2$CH$_2$NMe$_2$);
the lithium precursor being LiN(CH$_2$CHEtNMe$_2$)(CH$_2$CH$_2$NMe$_2$);
the lithium precursor being LiN(CMe$_2$CH$_2$NMe$_2$)(CH$_2$CH$_2$NMe$_2$);
the lithium precursor being LiN(CH$_2$CMe$_2$NMe$_2$)(CH$_2$CH$_2$NMe$_2$);
the lithium precursor being LiN(CH$_2$CH$_2$NMe$_2$)(CH$_2$CH$_2$CH$_2$NMe$_2$);
the lithium precursor being LiNMe(CH$_2$CH$_2$OMe);
the lithium precursor being LiNMe(CH$_2$CH$_2$OEt);
the lithium precursor being LiNMe(CH$_2$CH$_2$OiPr);
The lithium precursor being LiNMe(CH$_2$CH$_2$OtBu);
the lithium precursor being LiNEt(CH$_2$CH$_2$OMe);
the lithium precursor being LiNEt(CH$_2$CH$_2$OEt);
the lithium precursor being LiNiPr(CH$_2$CH$_2$OMe);
the lithium precursor being LiNtBu(CH$_2$CH$_2$OMe);
the lithium precursor being LiN(CH$_2$CH$_2$OMe)$_2$;
the lithium precursor being LiN(CH$_2$CH$_2$OEt)$_2$;
the lithium precursor being LiN(CH$_2$CH$_2$OiPr)$_2$;
the lithium precursor being LiN(CH$_2$CH$_2$OtBu)$_2$,
the lithium precursor being LiN(CH$_2$CH$_2$NMe$_2$)(CH$_2$CH$_2$OMe);
the lithium precursor being LiN(CH$_2$CH$_2$NMe$_2$)(CH$_2$CH$_2$OEt);
the lithium precursor being LiN(CH$_2$CH$_2$NMe$_2$)(CH$_2$CH$_2$OiPr);
the lithium precursor being LiN(CH$_2$CH$_2$NMe$_2$)(CH$_2$CH$_2$OtBu);
the lithium precursor being LiNMe(CH$_2$CH(OMe)$_2$);
the vapor deposition method being ALD, CVD, spray coating, dip coating, slit coating, spin-on deposition or a combination thereof;
the vapor deposition method being ALD;
the vapor deposition method being CVD;
the temperature within the reaction chamber ranging from a temperature below room temperature;
the temperature within the reaction chamber ranging from about 0° C. to about 600° C.;
the temperature within the reaction chamber ranging from about 15° C. to about 600° C.;
the temperature within the reaction chamber ranging from about 125° C. to about 250° C.;
the temperature range of the reactor being from approximately 20° C. to approximately 1000° C.;
the deposition temperature ranging from approximately 20° C. to approximately 550° C. for a plasma deposition process;
the deposition temperature ranging from approximately 100° C. to approximately 500° C. for ALD and CVD;
the deposition temperature ranging from approximately 250° C. to approximately 350° C. for ALD and CVD;
the deposition temperature ranging from approximately 200° C. to approximately 80° C. for a thermal process;
the deposition temperature ranging from approximately 400° C. to approximately 60° C. for a thermal process;
the deposition temperature being 100° C. for ALD;
the deposition temperature being 125° C. for ALD;
the deposition temperature being 135° C. for ALD;
the deposition temperature being 150° C. for ALD;
the deposition temperature being 175° C. for ALD;
the deposition temperature being 200° C. for ALD;
the deposition temperature being 250° C. for ALD;
the deposition temperature being 500° C. for CVD;
the deposition temperature being 200° C. for CVD;
the deposition temperature being 300° C. for CVD;
the deposition temperature being 400° C. for CVD;
the deposition temperature being 500° C. for CVD;
the temperature of the substrate ranging from room temperature to approximately 600° C.;
the lithium precursor being a silicon-free lithium precursor;
the lithium precursor being a monomer, a dimer, a trimer, or combinations thereof;
further comprising the step of delivering into the reactor a co-reactant;
the co-reactant being selected from O$_3$, O$_2$, H$_2$O, trimethylphosphate, an alkylphosphate, an alkylphosphimine, NO, N$_2$O, H$_2$O$_2$, O radicals, or combinations thereof;
the co-reactant being selected from N$_2$, NH$_3$, N$_2$H$_4$, or an alkylhydrazine;
the co-reactant being O$_3$;
the lithium precursor being liquid below 150° C.;
the lithium precursor being liquid at 50° C.;
the lithium precursor being liquid at 25° C.;
the Li-containing film, islet or cluster being a film, islet or cluster of Li$_2$O, LiOH, Li$_2$S, LiN, LiF, lithium carbonate, lithium, aluminum fluorate, lithium aluminum oxide, lithium aluminum, lithium cobalt oxide, lithium titanate, lithium zirconate, lithium niobate, LiPON, lithium phosphate, lithium borate, lithium borophosphate, lithium niobate, lithium zirconium oxides, or the like.

Also, disclosed is a composition comprising a lithium precursor having a general formula:

$$[\text{Li}—\text{NL}^1\text{L}^2\text{-D}_x]_y \quad (I)$$

wherein
L$^1$ has a general formula: C$_m$H$_n$, (C$_m$H$_n$)-ER$^1$R$^2$) or (C$_m$H$_n$)-E'R$^1$), wherein
C$_m$H$_n$ is a linear, branched or cyclic alkyl groups;
m and n are independent integers, 1≤m≤16, 1≤n≤16;
E is B, N;

E' is a divalent element;

R$^1$ and R$^2$ each are independently selected from the group consisting of hydrogenlinear, branched or cyclic alkyl groups, or linear, branched or cyclic alkyl groups substituted by other atoms or groups;

L$^2$ has a general formula: $(C_pH_q)$-ER$^3$R$^4$ or $(C_pH_q)$-E'R$^3$, wherein $C_pH_q$ is a linear, branched or cyclic alkyl groups;

p and q are independent integers, $1 \le p \le 16$, $1 \le q \le 16$;

E is B, N;

E' is a divalent element;

R$^3$ and R$^4$ each are independently selected from the group consisting of linear, branched or cyclic alkyl groups, or linear, branched or cyclic alkyl groups substituted by other atoms or groups;

D is independently selected from monodentate, bidentate, tridentate, or polydentate neutral coordinating ligand system;

x is an integer, $0 \le x \le 4$; and y is the degree of association of the molecule, $1 \le y \le 6$.

The disclosed compositions include one or more of the following aspects:

L$^1$ being a $C_1$-$C_{16}$ linear, branched or cyclic carbon chains, or of the form $(C_mH_n)$-E'R$^1$R$^2$ or $(C_mH_n)$-E'R$^1$, wherein $C_mH_n$ is an alkyl chain and may be linear, branched or cyclic alkyl groups; E represents B, N;

E' represents a divalent element such as O, S;

m is an integer which value is 1 or an integer ranging from 1 to 8;

n is an independent integer ranging from 2 to 16;

R$^1$ is independent and selected from the group consisting of hydrogen, linear, branched or cyclic $C_1$-$C_8$ alkyl groups, or linear, branched or cyclic alkyl groups substituted by other atoms or groups;

R$^2$ is independent and selected from the group consisting of hydrogen, linear, branched or cyclic $C_1$-$C_8$ alkyl groups, or linear, branched or cyclic alkyl groups substituted by other atoms or groups;

L$^2$ being of the form $(C_pH_q)$-ER$^3$R$^4$ or $(C_pH_q)$-E'R$^3$, wherein $C_pH_q$ is an alkyl chain and may be linear, branched or cyclic alkyl groups; E represents B, N;

E' represents a divalent element such as O, S;

p and q are independent integers ranging from 1 to 16, preferably p is comprised from 1 to 8 and q is comprised from 2 to 16, most preferably p is different from m;

R$^3$ and R$^4$ are independent and selected from the group consisting of hydrogen, linear, branched or cyclic alkyl groups, or linear, branched or cyclic alkyl groups substituted by other atoms or groups;

D being independently selected from monodentate, bidentate, tridentate, or polydentate neutral coordinating ligand system, preferably a monodentate or a bidentate;

x being an integer comprised between 0 and 4;

y representing the degree of association of the molecule and is comprised between 1 and 6;

provided that L$^1$=Me, L$^2$={$C_pH_q$=CH$_2$H$_2$, E=N, and both R$^3$ and R$^4$ are Me}, x=0 is excluded;

provided that L$^1$=Et, L$^2$={$C_pH_q$=CH$_2$CH$_2$, E=N, and both R$^3$ and R$^4$ are Me}, x=0 is excluded;

provided that L$^1$=iPr, L$^2$={$C_pH_q$=CH$_2$CH$_2$, E=N, and both R$^3$ and R$^4$ are Me}, x=0 is excluded;

provided that L$^1$=tBu, L$^2$={$C_pH_q$=CH$_2$CH$_2$, E=N, and both R$^3$ and R$^4$ are Me}, x=0 is excluded;

provided that L$^1$=tBu, L$^2$={$C_pH_q$=CMeHCH$_2$, E=N, and both R$^3$ and R$^4$ are Me}, x=0 is excluded;

provided that L$^1$=tBu, L$^2$={$C_pH_q$=CH$_2$CHMe, E=N, and both R$^3$ and R$^4$ are Me}, x=0 is excluded;

provided that L$^1$={$C_mH_n$=CH$_2$CH$_2$, E=N, both R$^1$ and R$^2$ are Me}, L$^2$={$C_pH_q$=CH$_2$CH$_2$, E=N, both R$^3$ and R$^4$ are Me}, x=0 is excluded;

provided that L$^1$={$C_mH_n$=CH$_2$CH$_2$, E=N, both R$^1$ and R$^2$ are Et}, L$^2$={$C_pH_q$=CH$_2$CH$_2$, E=N, both R$^3$ and R$^4$ are Et}, x=0 is excluded; and provided that L$^1$=Me, L$^2$={$C_pH_4$=CH$_2$CH$_2$, E'=O, R$^3$ is Me}, x=0 is excluded;

the lithium precursor being selected from LiNMe(CH$_2$CH$_2$NMe$_2$), LiNMe(CH$_2$CH$_2$NMe$_2$)(1,2-diethoxyethane), LiNMe(CH$_2$CH$_2$NMe$_2$)(1,2-dimethoxyethane), LiNEt(CH$_2$CH$_2$NMe$_2$), LiNiPr(CH$_2$CH$_2$NMe$_2$), LiNtBu(CH$_2$CH$_2$NMe$_2$), LiNtBu(CH$_2$CH$_2$NEtMe), LiNtBu(CHMeCH$_2$NMe$_2$), LiNtBu(CH$_2$CHMeNMe$_2$), LiN(CH$_2$CH$_2$NMe$_2$)$_2$, LiN(CH$_2$CH$_2$NEt$_2$)$_2$, LiN(CH$_2$CH$_2$NiPr$_2$)$_2$, LiN(CH$_2$CH$_2$NEtMe)$_2$, LiN(CH$_2$CH$_2$CH$_2$NMe$_2$)$_2$, LiN(CHMeCH$_2$NMe$_2$)$_2$, LiN(CHMeCH$_2$NMe$_2$)(CH$_2$CH$_2$NMe$_2$), LiN(CH$_2$CHMeNMe$_2$)$_2$, LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NMe$_2$)(CH$_2$CH$_2$CH$_2$NMe$_2$), LiNMe(CH$_2$CH$_2$OMe), LiNMe(CH$_2$CH$_2$OEt), LiNMe(CH$_2$CH$_2$OiPr) LiNMe(CH$_2$CH$_2$OtBu), LiNEt(CH$_2$CH$_2$OMe), LiNEt(CH$_2$CH$_2$OEt), LiNiPr(CH$_2$CH$_2$OMe), LiNtBu(CH$_2$CH$_2$OMe), LiN(CH$_2$CH$_2$OMe)$_2$, LiN(CH$_2$CH$_2$OEt)$_2$, LiN(CH$_2$CH$_2$OiPr)$_2$, LiN(CH$_2$CH$_2$OtBu)$_2$, LiN(CH$_2$CH$_2$NMe$_2$)(CH$_2$CH$_2$OMe), LiN(CH$_2$CH$_2$NMe$_2$)(CH$_2$CH$_2$OEt), LiN(CH$_2$CH$_2$NMe$_2$)(CH$_2$CH$_2$OiPr), LiN(CH$_2$CH$_2$NMe$_2$)(CH$_2$CH$_2$OtBu), LiNMe(CH$_2$CH(OMe)$_2$), or the like;

the lithium precursor being selected from LiNtBu(CH$_2$CH$_2$NMe$_2$), LiNtBu(CH$_2$CH$_2$NEtMe), LiNtBu(CHMeCH$_2$NMe$_2$). LiNtBu(CH$_2$CHMeNMe$_2$), LiN(CH$_2$CH$_2$NEtMe)$_2$, LiN(CH$_2$CH$_2$OEt)$_2$, LiN(CH$_2$CH$_2$NMe$_2$)$_2$, LiN(CH$_2$CH$_2$CH$_2$NMe$_2$)$_2$, LiN(CH$_2$CH$_2$NMeEt)$_2$, LiN(CHMeCH$_2$NMe$_2$)(CH$_2$CH$_2$NMe$_2$), LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NiPr$_2$)$_2$, LiN(CH$_2$CH$_2$NMe$_2$)(CH$_2$CH$_2$CH$_2$NMe$_2$), LiN(CH$_2$CH$_2$OEt)$_2$, LiNMe(CH$_2$CH$_2$OEt), LiNMe(CH$_2$CH(OMe)$_2$), or the like;

the lithium precursor being LiNMe(CH$_2$CH$_2$NMe$_2$);

the lithium precursor being LiNMe(CH$_2$CH$_2$NMe$_2$)(1;2-diethoxyethane);

the lithium precursor being LiNMe(CH$_2$CH$_2$NMe$_2$)(1;2-dimethoxyethane);

the lithium precursor being LiNEt(CH$_2$CH$_2$NMe$_2$);

the lithium precursor being LiNiPr(CH$_2$CH$_2$NMe$_2$);

the lithium precursor being LiNtBu(CH$_2$CH$_2$NMe$_2$);

the lithium precursor being LiNtBu(CH$_2$CH$_2$NEtMe);

the lithium precursor being LiNtBu(CHMeCH$_2$NMe$_2$);

the lithium precursor being LiNtBu(CH$_2$CHMeNMe$_2$);

the lithium precursor being LiN(CH$_2$CH$_2$NMe$_2$)$_2$;

the lithium precursor being LiN(CH$_2$CH$_2$NEt$_2$)$_2$;

the lithium precursor being LiN(CH$_2$CH$_2$NiPr$_2$)$_2$;

the lithium precursor being LiN(CH$_2$CH$_2$NEtMe)$_2$;

the lithium precursor being LiN(CH$_2$CH$_2$CH$_2$NMe$_2$)$_2$;
a the lithium precursor being LiN(CHMeCH$_2$NMe$_2$)$_2$;
the lithium precursor being LiN(CHMeCH$_2$NMe$_2$)(CH$_2$CH$_2$NMe$_2$);
the lithium precursor being LiN(CH$_2$CHMeNMe$_2$)$_2$;
the lithium precursor being LiN(CH$_2$CHMeNMe$_2$)(CH$_2$CH$_2$NMe$_2$);
the lithium precursor being LiN(CHEtCH$_2$NMe$_2$)(CH$_2$CH$_2$NMe$_2$);
the lithium precursor being LiN(CH$_2$CHEtNMe$_2$)(CH$_2$CH$_2$NMe$_2$);
the lithium precursor being LiN(CMe$_2$CH$_2$NMe$_2$)(CH$_2$CH$_2$NMe$_2$),
the lithium precursor being LiN(CH$_2$CMe$_2$NMe$_2$)(CH$_2$CH$_2$NMe$_2$);
the lithium precursor being LiN(CH$_2$CH$_2$NMe$_2$)(CH$_2$CH$_2$CH$_2$NMe$_2$);
the lithium precursor being LiNMe(CH$_2$CH$_2$OMe);
the lithium precursor being LiNMe(CH$_2$CH$_2$OEt);
the lithium precursor being LiNMe(CH$_2$CH$_2$OiPr);
the lithium precursor being LiNMe(CH$_2$CH$_2$OtBu);
the lithium precursor being LiNEt(CH$_2$CH$_2$OMe);
the lithium precursor being LiNEt(CH$_2$CH$_2$OEt);
a the lithium precursor being LiNiPr(CH$_2$CH$_2$OMe);
a the lithium precursor being LiNtBu(CH$_2$CH$_2$OMe);
the lithium precursor being LiN(CH$_2$CH$_2$OMe)$_2$;
the lithium precursor being LiN(CH$_2$CH$_2$OEt)$_2$;
a the lithium precursor being LiN(CH$_2$CH$_2$OiPr)$_2$,
the lithium precursor being LiN(CH$_2$CH$_2$OtBu)$_2$;
the lithium precursor being LiN(CH$_2$CH$_2$NMe$_2$)(CH$_2$CH$_2$OMe);
a the lithium precursor being LiN(CH$_2$CH$_2$NMe$_2$)(CH$_2$CH$_2$OEt);
a the lithium precursor being LiN(CH$_2$CH$_2$NMe$_2$)(CH$_2$CH$_2$OiPr);
the lithium precursor being LiN(CH$_2$CH$_2$NMe$_2$)(CH$_2$CH$_2$OtBu);
the lithium precursor being LiNMe(CH$_2$CH(OMe)$_2$); and
the lithium precursor having a purity of ranging from approximately 93% by weight or w/w to approximately 100% w/w, preferably ranging from approximately 99% w/w to approximately 99.999% w/w, more preferably, ranging from approximately 99% w/w to approximately 100% w/w.

Also, disclosed is a film, islet or cluster forming precursor having a general formula:

$$[\text{Li}-\text{NL}^1\text{L}^2\text{-D}_x]_y \quad (I)$$

wherein
L$^1$ has a general formula: C$_m$H$_n$, (C$_m$H$_n$)-ER$^1$R$^2$ or (C$_m$H$_n$)-E'R$^1$), wherein
(C$_m$H$_n$) is a linear, branched or cyclic alkyl groups;
m and n are independent integers, 1≤m≤16, 1≤n≤16;
E is B, N;
E' is a divalent element;
R$^1$ and R$^2$ each are independently selected from the group consisting of hydrogen, linear, branched or cyclic alkyl groups, or linear, branched or cyclic alkyl groups substituted by other atoms or groups;
L$^2$ has a general formula: (C$_p$H$_q$)-ER$^3$R$^4$ or (C$_p$H$_q$)-E'R$^3$, wherein
C$_p$H$_q$ is a linear, branched or cyclic alkyl groups;
p and q are independent integers, 1≤p≤16, 1≤q≤16;
E is B, N;
E' is a divalent element;
R$^3$ and R$^4$ each are independently selected from the group consisting of hydrogen, linear, branched or cyclic alkyl groups, or linear, branched or cyclic alkyl groups substituted by other atoms or groups;
D is independently selected from monodentate, bidentate, tridentate, or polydentate neutral coordinating ligand system;
x is an integer, 0≤x≤4; and
y is the degree of association of the molecule, 1≤y≤6.

The disclosed film, islet or cluster forming precursors include one or more of the following aspects:
L$^1$ being a C$_1$-C$_{16}$ linear, branched or cyclic carbon chains, or of the form (C$_m$H$_n$)-E'R$^1$R$^2$ or (C$_m$H$_n$)-E'R$^1$, wherein
C$_m$H$_n$ is an alkyl chain and may be linear, branched or cyclic alkyl groups; E represents B, N;
E' represents a divalent element such as O, S;
m is an integer which value is 1 or an integer ranging from 1 to 8;
n is an independent integer ranging from 2 to 16;
R$^1$ is independent and selected from the group consisting of hydrogen, linear, branched or cyclic C$_1$-C$_8$ alkyl groups, or linear, branched or cyclic alkyl groups substituted by other atoms or groups;
R$^2$ is independent and selected from the group consisting of hydrogen, linear, branched or cyclic C$_1$-C$_8$ alkyl groups, or linear, branched or cyclic alkyl groups substituted by other atoms or groups;
L$^2$ being of the form (C$_p$H$_q$)-ER$^3$R$^4$ or (C$_p$H$_q$)-E'R$^3$, wherein C$_p$H$_q$ is an alkyl chain and may be linear, branched or cyclic alkyl groups;
E represents B, N;
E' represents a divalent element such as O, S;
p and q are independent integers ranging from 1 to 16, preferably p is comprised from 1 to 8 and q is comprised from 2 to 16, most preferably p is different from m;
R$^3$ and R$^4$ are independent and selected from the group consisting of hydrogen, linear, branched or cyclic alkyl groups, or linear, branched or cyclic alkyl groups substituted by other atoms or groups;
D being independently selected from monodentate, bidentate, tridentate, or polydentate neutral coordinating ligand system. Preferably a monodentate or a bidentate;
x being an integer comprised between 0 and 4; and
y representing the degree of association of the molecule and is comprised between 1 and 6;
the film, islet or cluster forming precursor being selected from LiNMe(CH$_2$CH$_2$NMe$_2$), LiNMe(CH$_2$CH$_2$NMe$_2$)(1,2-diethoxyethane), LiNMe(CH$_2$CH$_2$NMe$_2$)(1,2-dimethoxyethane), LiNEt(CH$_2$CH$_2$NMe$_2$), LiNiPr(CH$_2$CH$_2$NMe$_2$), LiNtBu(CH$_2$CH$_2$NMe$_2$), LiNtBu(CH$_2$CH$_2$NEtMe), LiNtBu(CHMeCH$_2$NMe$_2$), LiNtBu(CH$_2$CHMeNMe$_2$), LiN(CH$_2$CH$_2$NMe$_2$)$_2$, LiN(CH$_2$CH$_2$NEt$_2$)$_2$, LiN(CH$_2$CH$_2$NiPr$_2$)$_2$, LiN(CH$_2$CH$_2$NEtMe)$_2$, LiN(CH$_2$CH$_2$CH$_2$NMe$_2$)$_2$, LiN(CHMeCH$_2$NMe$_2$)$_2$, LiN(CHMeCH$_2$NMe$_2$)(CH$_2$CH$_2$NMe$_2$), LiN(CH$_2$CHMeNMe$_2$)$_2$, LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NMe$_2$)(CH$_2$CH$_2$CH$_2$NMe$_2$), LiNMe(CH$_2$CH$_2$OMe), LiNMe(CH$_2$CH$_2$OEt), LiNMe(CH$_2$CH$_2$OiPr) LiNMe(CH$_2$CH$_2$OtBu), LiNEt(CH$_2$CH$_2$OMe), LiNEt(CH$_2$CH$_2$OEt), LiNiPr(CH$_2$CH$_2$OMe), LiNtBu(CH$_2$CH$_2$OMe), LiN(CH$_2$CH$_2$OMe)$_2$, LiN(CH$_2$CH$_2$OEt)$_2$, LiN (CH$_2$CH$_2$OiPr)$_2$, LiN(CH$_2$CH$_2$OtBu)$_2$, LiN(CH$_2$CH$_2$NMe$_2$)(CH$_2$CH$_2$OMe), LiN(CH$_2$CH$_2$NMe$_2$)(CH$_2$CH$_2$OEt), LiN(CH$_2$CH$_2$NMe$_2$)(CH$_2$CH$_2$OiPr), LiN(CH$_2$CH$_2$NMe$_2$)(CH$_2$CH$_2$OtBu), LiNMe(CH$_2$CH(OMe)$_2$), or the like;

the film, islet or cluster forming precursor being LiNtBu(CH$_2$CH$_2$NMe$_2$), LiNtBu(CH$_2$CH$_2$NEtMe), LiNtBu(CHMeCH$_2$NMe$_2$), LiNtBu(CH$_2$CHMeNMe$_2$), LiN(CH$_2$CH$_2$NEtMe)$_2$, LiN(CH$_2$CH$_2$OEt)$_2$, LiN(CH$_2$CH$_2$NMe$_2$)$_2$, LiN(CH$_2$CH$_2$CH$_2$NMe$_2$)$_2$, LiN(CH$_2$CH$_2$NMeEt)$_2$, LiN(CHMeCH$_2$NMe$_2$)(CH$_2$CH$_2$NMe$_2$), LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NiPr$_2$)$_2$, LiN(CH$_2$CH$_2$NMe$_2$)(CH$_2$CH$_2$CH$_2$NMe$_2$), LiN(CH$_2$CH$_2$OEt)$_2$. LiNMe(CH$_2$CH$_2$OEt), LiNMe(CH$_2$CH(OMe)$_2$) or the like;

the film, islet or cluster being LiNMe(CH$_2$CH$_2$NMe$_2$);

the film, islet or cluster being LiNMe(CH$_2$CH$_2$NMe$_2$)(1;2-diethoxyethane);

the film, islet or cluster being LiNMe(CH$_2$CH$_2$NMe$_2$)(1;2-dimethoxyethane);

the film, islet or cluster being LiNEt(CH$_2$CH$_2$NMe$_2$);

the film, islet or cluster being LiNiPr(CH$_2$CH$_2$NMe$_2$);

the film, islet or cluster being LiNtBu(CH$_2$CH$_2$NMe$_2$);

the film, islet or cluster being LiNtBu(CH$_2$CH$_2$NEtMe);

The film, islet or cluster being LiNtBu(CHMeCH$_2$NMe$_2$);

the film, islet or cluster being LiNtBu(CH$_2$CHMeNMe$_2$);

the film, islet or cluster being LiN(CH$_2$CH$_2$NMe$_2$)$_2$;

the film, islet or cluster being LiN(CH$_2$CH$_2$NEt$_2$)$_2$;

the film, islet or cluster being LiN(CH$_2$CH$_2$NiPr$_2$)$_2$;

the film, islet or cluster being LiN(CH$_2$CH$_2$NEtMe)$_2$;

the film, islet or cluster being LiN(CH$_2$CH$_2$CH$_2$NMe$_2$)$_2$;

the film, islet or cluster being LiN(CHMeCH$_2$NMe$_2$)$_2$;

the film, islet or cluster being LiN(CHMeCH$_2$NMe$_2$)(CH$_2$CH$_2$NMe$_2$);

the film, islet or cluster being LiN(CH$_2$CHMeNMe$_2$)$_2$;

the film, islet or cluster being LiN(CH$_2$CHMeNMe$_2$)(CH$_2$CH$_2$NMe$_2$);

the film, islet or cluster being LiN(CHEtCH$_2$NMe$_2$)(CH$_2$CH$_2$NMe$_2$);

the film, islet or cluster being LiN(CH$_2$CHEtNMe$_2$)(CH$_2$CH$_2$NMe$_2$);

the film, islet or cluster being LiN(CMe$_2$CH$_2$NMe$_2$)(CH$_2$CH$_2$NMe$_2$);

the film, islet or cluster being LiN(CH$_2$CMe$_2$NMe$_2$)(CH$_2$CH$_2$NMe$_2$);

the film, islet or cluster being LiN(CH$_2$CH$_2$NMe$_2$)(CH$_2$CH$_2$CH$_2$NMe$_2$);

the film, islet or cluster being LiNMe(CH$_2$CH$_2$OMe);

the film, islet or cluster being LiNMe(CH$_2$CH$_2$OEt);

the film, islet or cluster being LiNMe(CH$_2$CH$_2$OiPr);

the film, islet or cluster being LiNMe(CH$_2$CH$_2$OtBu);

the film, islet or cluster being LiNEt(CH$_2$CH$_2$OMe);

the film, islet or cluster being LiNEt(CH$_2$CH$_2$OEt);

the film, islet or cluster being LiNiPr(CH$_2$CH$_2$OMe), the film, islet or cluster being LiNtBu(CH$_2$CH$_2$OMe);

the film, islet or cluster being LiN(CH$_2$CH$_2$OMe)$_2$;

the film, islet or cluster being LiN(CH$_2$CH$_2$OEt)$_2$;

the film, islet or cluster being LiN(CH$_2$CH$_2$OiPr)$_2$;

the film, islet or cluster being LiN(CH$_2$CH$_2$OtBu)$_2$;

the film, islet or cluster being LiN(CH$_2$CH$_2$NMe$_2$)(CH$_2$CH$_2$OMe);

the film, islet or cluster being LiN(CH$_2$CH$_2$NMe$_2$)(CH$_2$CH$_2$OEt);

the film, islet or cluster being LiN(CH$_2$CH$_2$NMe$_2$)(CH$_2$CH$_2$OiPr);

the film, islet or cluster being LiN(CH$_2$CH$_2$NMe$_2$)(CH$_2$CH$_2$OtBu);

the film, islet or cluster being LiNMe(CH$_2$CH(OMe)$_2$); and the film, islet or cluster forming precursor having a purity of ranging from approximately 93% by weight or w/w to approximately 100% w/w, preferably ranging from approximately 99% w/w to approximately 99.999% w/w, more preferably, ranging from approximately 99% w/w to approximately 100% w/w.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "ambient temperature" refers to an environment temperature approximately 20° C. to approximately 25° C.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of the same R group. For example in the formula MR$^1_x$(NR$^2$R$^3$)$_{(4-x)}$, where x is 2 or 3, the two or three R$^1$ groups may, but need not be identical to each other or to R$^2$ or to R$^3$. Further, it should be understood that unless specifically stated otherwise, values of R groups are independent of each other when used in different formulas.

As used in the disclosed embodiments, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl group, ethyl group, propyl group, butyl group, etc. Examples of the branched alkyls group include without limitation, t-butyl. Examples of cyclic alkyl groups include without limitation, cyclopropyl groups, cyclopentyl groups, cyclohexyl groups, etc.

As used in the disclosed embodiments, the abbreviation "Me" refers to a methyl group; the abbreviation "Et" refers to an ethyl group; the abbreviation "Pr" refers to a propyl group.

The term "islet" or "cluster" used herein refer to the formation of a small agglomerate of some material laid on or spread over a surface and that the surface may range from as large as the entire wafer to as small as a trench or a line.

The term "substrate" refers to a material or materials on which a process is conducted. The substrate may refer to a wafer having a material or materials on which a process is conducted. The substrates may be any suitable wafer or support used in semiconductor, photovoltaic, flat panel, LCD-TFT device manufacturing, MEMS, lithium ion battery manufacturing, electrochromic window manufacturing, organic or inorganic powder, electrode and/or material deposited upon. The substrate may also have one or more layers of differing materials already deposited upon it from a previous manufacturing step. For example, the support may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, manganese, iron, aluminum, silver, gold, etc.), an organic layer such as amorphous carbon, fluorinated carbons, fluorinated hydrocarbons, fluorine-containing materials, or combinations thereof. Furthermore, the substrate may be planar or patterned, spherical, rounded, or without any defined or regular shape. The substrate may include layers of oxides which are used as electrode active materials. One of ordinary skill in the art will recognize that the term "film" or "layer" used herein refer to a thickness of some material laid on or spread over a surface and that the surface may be a trench or a line. Throughout the specification and claims, the wafer and any associated layers, islets and/or clusters thereon are referred to as substrates.

The term "wafer" or "patterned wafer" refers to a wafer having a stack of films such as silicon-containing films on a substrate and a patterned hardmask layer on the stack of the films such as silicon-containing films formed for pattern etch. The term "wafer" or "patterned wafer" may also refer to a trench wafer having an aspect ratio.

The term "support" refers to a material consisting of a composite of materials, for example electrode active materials, binders, electrolyte and carbons.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line. Note that herein, the terms "islet" and "clusters" may be used interchangeably. It is understood that a islet may correspond to, or related to a cluster, and that the cluster may refer to the islet.

Note that herein, the terms "deposition temperature", "process temperature", "substrate temperature" and "reactor temperature" may be used interchangeably. It is understood that a substrate temperature or a reactor temperature or a process temperature may correspond to, or be related to a deposition temperature, and that the deposition temperature may refer to the substrate temperature or reactor temperature or a process temperature.

Note that herein, the terms "precursor" and "deposition compound" and "deposition gas" may be used interchangeably. It is understood that a precursor may correspond to, or be related to a deposition compound, and that the deposition compound may refer to the precursor.

The standard abbreviations of the elements from the periodic table of elements are used herein. It should be understood that elements might be referred to by these abbreviation (e.g., Li refers to lithium, Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the lithium-containing films or islets, made of materials such as lithium phosphate, lithium borate and lithium borophosphate, are listed throughout the specification and claims without reference to their proper stoichiometry. The lithium-containing films or islets may also include dopants, such as B, C, N and/or Ge.

Ranges may be expressed herein as from about one particular value, and/or to about another particular value. When such a range is expressed, it is to be understood that another embodiment is from the one particular value and/or to the other particular value, along with all combinations within said range. Any and all ranges recited in the disclosed embodiments are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
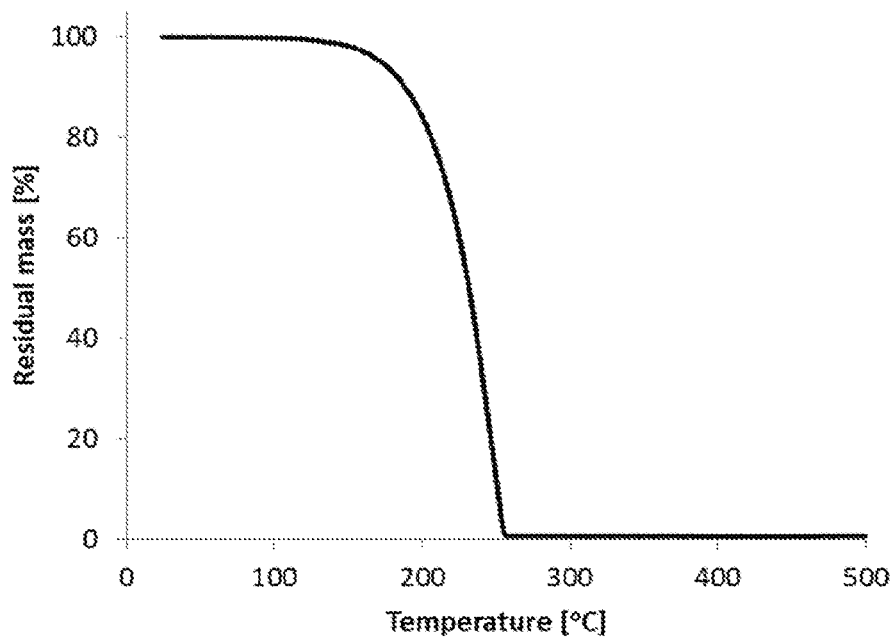
FIG. 1 is a graph of the thermogravimetric analysis (TGA) (760 Torr) of $LiN(CH_2CH_2NMe_2)_2$.

Disclosed are lithium-containing films, islets or cluster forming compositions comprising silicon-free lithium precursors, methods of synthesizing silicon-free lithium precursors, and methods of using silicon-free lithium precursors to deposit a lithium-containing film, islet or cluster. The disclosed silicon-free lithium precursors are liquid below 150° C., preferably liquid at approximately 50° C., most preferably liquid at approximately 25° C. or room temperature. The disclosed silicon-free lithium precursors are suitable for ALD and CVD applications.

The disclosed silicon-free lithium precursors have a general formula:

$$[Li-NL^1L^2-D_x]_y \quad (I)$$

wherein
  $L^1$ has a general formula: $C_mH_n$, $(C_mH_n)$-$ER^1R^2$) or $(C_mH_n)$-$E'R^1$), wherein
    $C_mH_n$ is a linear, branched or cyclic alkyl groups;
    m and n are independent integers, $1 \leq m \leq 16$, $1 \leq n \leq 16$;
    E is B, N;
    E' is a divalent element;
    $R^1$ and $R^2$ each are independently selected from the group consisting of linear, branched or cyclic alkyl groups, or linear, branched or cyclic alkyl groups substituted by other atoms or groups;
  $L^2$ has a general formula: $(C_pH_q)$-$ER^3R^4$ or $(C_pH_q)$-$E'R^3$, wherein
    $C_pH_q$ is a linear, branched or cyclic alkyl groups;
    p and q are independent integers, $1 \leq p \leq 16$, $1 \leq q \leq 16$;
    E is B, N;
    E' is a divalent element;
    $R^3$ and $R^4$ each are independently selected from the group consisting of linear, branched or cyclic alkyl groups, or linear, branched or cyclic alkyl groups substituted by other atoms or groups;
  D is independently selected from monodentate, bidentate, tridentate, or polydentate neutral coordinating ligand system;
  x is an integer, $0 \leq x \leq 4$; and
  y is the degree of association of the molecule, $1 \leq y \leq 6$.

Preferably, in the general formula (I), D is a monodentate or a bidentate; E is N, B; E' is O, S; m is $1 \leq m \leq 8$ and n is $2 \leq n \leq 16$; p is $1 \leq m \leq 8$ and q is $2 \leq n \leq 16$; respectively.

More preferably, the disclosed silicon-free lithium precursors having the general formula (I), wherein:
  $L^1$ is a $C_1$-$C_{16}$ linear, branched or cyclic carbon chains, or of the form $(C_mH_n)$-$ER^1R^2$ or $(C_mH_n)$-$E'R^1$, wherein
    $C_mH_n$ is an alkyl chain and may be linear, branched or cyclic alkyl groups;
    E represents B, N;
    E' represents a divalent element such as O, S;
    m is an integer which value is 1 or an integer ranging from 1 to 8;
    n is an independent integer ranging from 2 to 16;
    $R^1$ is independent and selected from the group consisting of hydrogen, linear, branched or cyclic $C_1$-$C_8$ alkyl groups, or linear, branched or cyclic alkyl groups substituted by other atoms or groups;
    $R^2$ is independent and selected from the group consisting of hydrogen, linear, branched or cyclic $C_1$-$C_8$ alkyl groups, or linear, branched or cyclic alkyl groups substituted by other atoms or groups;
  $L^2$ is of the form $(C_pH_q)$-$ER^3R^4$ or $(C_pH_q)$-$E'R^3$, wherein
    $C_pH_q$ is an alkyl chain and may be linear, branched or cyclic alkyl groups;
    E represents B, N;
    E' represents a divalent element such as O, S;
    p and q are independent integers ranging from 1 to 16, preferably p is comprised from 1 to 8 and q is comprised from 2 to 16, most preferably p is different from m;
    $R^3$ and $R^4$ are independent and selected from the group consisting of hydrogen, linear, branched or cyclic alkyl groups, or linear, branched or cyclic alkyl groups substituted by other atoms or groups;
  D is independently selected from monodentate, bidentate, tridentate, or polydentate neutral coordinating ligand system, preferably a monodentate or a bidentate;
  x is an integer comprised between 0 and 4; and
  y represents the degree of association of the molecule and is comprised between 1 and 6,
  provided that x=0, p=2, q=4, E=N and both $L^2$, $R^3$ and $R^4$ are methyl is excluded;
  provided that x=0, p=2 or 3, q=4 or 6, E=N, $L^2$=tertiary butyl, $R^3$ and $R^4$ are methyl is excluded;
  provided that x=0, m=p=2, n=q=4, E=N, both $R^1$, $R^2$, $R^3$, $R^4$ are methyl is excluded;
  provided that x=0, m=p=2, n=q=4, E'=O, both $R^1$ and $R^3$ are methyl is excluded;
  provided that x=0, m=2, n=4, E'=O and $R^1$ is methyl is excluded;
  provided that $L^1$=Me, $L^2$={$C_pH_q$=$CH_2CH_2$, E=N, and both $R^3$ and $R^4$ are Me}, x=0 is excluded;
  provided that $L^1$=Et, $L^2$={$C_pH_q$=$CH_2CH_2$, E=N, and both $R^3$ and $R^4$ are Me}, x=0 is excluded;
  provided that $L^1$=iPr, $L^2$={$C_pH_q$=$CH_2CH_2$, E=N, and both $R^3$ and $R^4$ are Me}, x=0 is excluded;
  provided that $L^1$=tBu, $L^2$={$C_pH_q$=$CH_2CH_2$, E=N, and both $R^3$ and $R^4$ are Me}, x=0 is excluded;
  provided that $L^1$=tBu, $L^2$={$C_pH_q$=CMeHCH_2, E=N, and both $R^3$ and $R^4$ are Me}, x=0 is excluded;
  provided that $L^1$=tBu, $L^2$={$C_pH_q$=$CH_2$CHMe, E=N, and both $R^3$ and $R^4$ are Me}, x=0 is excluded;
  provided that $L^1$={$C_mH_n$, =$CH_2CH_2$, E=N, both $R^1$ and $R^2$ are Me}, $L^2$={$C_pH_q$ $CH_2CH_2$, E=N, both $R^3$ and $R^4$ are Me}, x=0 is excluded;
  provided that $L^1$={$C_mH_n$=$CH_2CH_2$, E=N, both $R^1$ and $R^2$ are Et}, $L^2$={$C_pH_q$=$CH_2CH_2$, E=N, both $R^3$ and $R^4$ are Et}, x=0 is excluded; and provided that $L^1$=Me, $L^2$={$C_pH_q$=$CH_2CH_2$, E' =O, $R^3$ is Me}, x=0 is excluded.

Exemplary examples of the disclosed silicon-free lithium precursors shown in the general formula (I) include LiN$^t$Bu (CH$_2$CH$_2$NMe$_2$), LiN$^t$Bu(CH$_2$CH$_2$NEtMe), LiN$^t$Bu (CHMeCH$_2$NMe$_2$), LiN$^t$Bu(CH$_2$CHMeNMe$_2$), LiN (CH$_2$CH$_2$NEtMe)$_2$, LiN(CH$_2$CH$_2$OEt)$_2$, LiN (CH$_2$CH$_2$NMe$_2$)$_2$, LiN(CH$_2$CH$_2$CH$_2$NMe$_2$)$_2$, LiN (CH$_2$CH$_2$NMeEt)$_2$, LiN(CHMeCH$_2$NMe$_2$) (CH$_2$CH$_2$NMe$_2$), LiN(CH$_2$CHMeNMe$_2$)(CH$_2$CH$_2$NMe$_2$), LiN(CHEtCH$_2$NMe$_2$)(CH$_2$CH$_2$NMe$_2$), LiN (CH$_2$CHEtNMe$_2$)(CH$_2$CH$_2$NMe$_2$), LiN(CMe$_2$CH$_2$NMe$_2$) (CH$_2$CH$_2$NMe$_2$), LiN(CH$_2$CMe$_2$NMe$_2$)(CH$_2$CH$_2$NMe$_2$), LiN(CH$_2$CH$_2$N$^i$Pr$_2$)$_2$, LiN(CH$_2$CH$_2$NMe$_2$) (CH$_2$CH$_2$CH$_2$NMe$_2$), LiN(CH$_2$CH$_2$OEt)$_2$, LiNMe (CH$_2$CH$_2$OEt), LiNMe(CH$_2$CH(OMe)$_2$)

etc.

The disclosed silicon-free lithium precursors include LiN(CH$_2$CH$_2$NMe$_2$)$_2$, LiN(CHMeCH$_2$NMe$_2$)(CH$_2$CH$_2$NMe$_2$), LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiNtBu(CH$_2$CH$_2$NMe$_2$), LiNtBu(CH$_2$CH$_2$NEtMe). LiNtBu(CHMeCH$_2$NMe$_2$), LiNtBu(CH$_2$CHMeNMe$_2$), LiN(CH$_2$CH$_2$NEtMe)$_2$ and LiN(CH$_2$CH$_2$OEt)$_2$ and LiNMe(CH$_2$CH(OMe)$_2$).

The disclosed silicon-free lithium precursor is LiNtBu(CH$_2$CH$_2$NMe$_2$). The disclosed silicon-free lithium precursor is LiNtBu(CH$_2$CH$_2$NEtMe). The disclosed silicon-free lithium precursor is LiNtBu(CHMeCH$_2$NMe$_2$). The disclosed silicon-free lithium precursor is LiNtBu(CH$_2$CHMeNMe$_2$). The disclosed silicon-free lithium precursor is LiN(CH$_2$CH$_2$NEtMe)$_2$. The disclosed silicon-free lithium precursor is LiN(CH$_2$CH$_2$OEt)$_2$. The disclosed silicon-free lithium precursor is LiN(CH$_2$CH$_2$NMe$_2$)$_2$. The disclosed silicon-free lithium precursor is LiN(CH$_2$CH$_2$CH$_2$NMe$_2$)$_2$. The disclosed silicon-free lithium precursor is LiN(CH$_2$CH$_2$NMeEt)$_2$. The disclosed silicon-free lithium precursor is LiN(CHMeCH$_2$NMe$_2$)(CH$_2$CH$_2$NMe$_2$) The disclosed silicon-free lithium precursor is LiN(CH$_2$CHMeNMe$_2$)(CH$_2$CH$_2$NMe$_2$). The disclosed silicon-free lithium precursor is LiN(CHEtCH$_2$NMe$_2$)(CH$_2$CH$_2$NMe$_2$). The disclosed silicon-free lithium precursor is LiN(CH$_2$CHEtNMe$_2$)(CH$_2$CH$_2$NMe$_2$). The disclosed silicon-free lithium precursor is LiN(CMe$_2$CH$_2$NMe$_2$)(CH$_2$CH$_2$NMe$_2$). The disclosed silicon-free lithium precursor is LiN(CH$_2$CMe$_2$NMe$_2$)(CH$_2$CH$_2$NMe$_2$). The disclosed silicon-free lithium precursor is LiN(CH$_2$CH$_2$NiPr$_2$)$_2$. The disclosed silicon-free lithium precursor is LiN(CH$_2$CH$_2$NMe$_2$)(CH$_2$CH$_2$CH$_2$NMe$_2$). The disclosed silicon-free lithium precursor is LiN(CH$_2$CH$_2$OEt)$_2$. The disclosed silicon-free lithium precursor is LiNMe(CH$_2$CH$_2$OEt). The disclosed silicon-free lithium precursor is LiNMe(CH$_2$CH(OMe)$_2$)

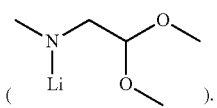

The disclosed silicon-free lithium precursors may be formulated on a form of a monomer, a dimer or a trimer with different associations or combinations.

Furthermore, the disclosed silicon-free lithium precursors may be specified through the following sub-formula.

In one embodiment, the disclosed silicon-free lithium precursors may be lithium aminoamides, where $L^1=C_mH_n$; $L^2=(C_pH_q)-NR^1R^2$ in the formula (I), having a general formula:

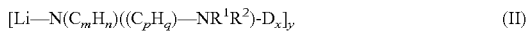

wherein
$C_mH_n$ and $C_pH_q$ each are independently a linear, branched or cyclic alkyl groups;

m, n, p, q each are independent integers, $1 \le m \le 16$, $1 \le n \le 16$, $1 \le p \le 16$, $1 \le q \le 16$, preferably with n=2m+1 and/or q=2p, more preferably $1 \le m \le 8$, $1 \le p \le 8$, $2 \le n \le 16$, $2 \le q \le 16$;

$R^1$ and $R^2$ are independently selected from hydrogen, linear, branched or cyclic alkyl groups, or linear, branched or cyclic alkyl groups substituted by other atoms or groups;

D is independently selected from monodentate, bidentate, tridentate, or polydentate neutral coordinating ligand system, preferably a monodentate or a bidentate;

x is an integer, $0 \le x \le 4$; and y is the degree of association of the molecule, $1 \le y \le 6$.

Exemplary examples of the disclosed silicon-free lithium precursors shown in the general formula (II) include: LiNMe(CH$_2$CH$_2$NMe$_2$), LiNMe(CH$_2$CH$_2$NMe$_2$)(1,2-diethoxyethane); LiNMe(CH$_2$CH$_2$NMe$_2$)(1; 2-dimethoxyethane); LiNEt(CH$_2$CH$_2$NMe$_2$), LiNiPr(CH$_2$CH$_2$NMe$_2$), LiNtBu(CH$_2$CH$_2$NMe$_2$), LiNtBu(CH$_2$CH$_2$NEtMe), LiNtBu(CHMeCH$_2$NMe$_2$), LiNtBu(CH$_2$CHMeNMe$_2$), or the likes. These molecules may be on the form of monomer, but may be formed with different associations such as dimer or trimer.

Alternatively, the disclosed silicon-free lithium precursors may be lithium diaminoamides, where $L^1=(C_mH_n)-NR^1R^2$; $L^2=(C_pH_q)-NR^3R^4$ in the formula (I), having a general formula:

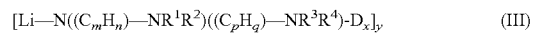

wherein
$C_mH_n$ and $C_pH_q$ each are independently linear, branched or cyclic alkyl groups;

m, n, p, q each are independent integers, $1 \le m \le 16$, $1 \le n \le 16$, $1 \le p \le 16$, $1 \le q \le 16$, preferably with n=2m and/or q=2p, more preferably $1 \le m \le 4$, $1 \le p \le 4$, $2 \le n \le 8$, $2 \le q \le 8$;

$R^1$, $R^2$, $R^3$ and $R^4$ each are independently selected from hydrogen, linear, branched or cyclic alkyl groups, and linear, branched or cyclic alkyl groups substituted by other atoms or groups;

D is independently monodentate, bidentate, tridentate, or polydentate neutral coordinating ligand system, preferably D is a monodentate or bidentate;

x is an integer, $0 \le x \le 4$; and y is the degree of association of the molecule, $1 \le y \le 6$.

Exemplary examples of the disclosed silicon-free lithium precursors shown in the general formula (III) include, LiN(CH$_2$CH$_2$NMe$_2$)$_2$, LiN(CH$_2$CH$_2$NEt$_2$)$_2$, LiN(CH$_2$CH$_2$NiPr$_2$)$_2$, LiN(CH$_2$CH$_2$NEtMe)$_2$, LiN(CH$_2$CH$_2$CH$_2$NMe$_2$)$_2$, LiN(CHMeCH$_2$NMe$_2$)$_2$, LiN(CHMeCH$_2$NMe$_2$)(CH$_2$CH$_2$NMe$_2$), LiN(CH$_2$CHMeNMe$_2$)$_2$, LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NMe$_2$)(CH$_2$CH$_2$CH$_2$NMe$_2$), etc.

Alternatively, the disclosed silicon-free lithium precursors may be lithium alkoxyamides, where $L^1=C_mH_n$; $L^2=(C_pH_q)-OR_1$ in the formula (I), having a general formula:

wherein
$C_mH_n$ and $C_pH_q$ each are independently linear, branched or cyclic alkyl groups;

m, n, p, q each are independent integers, $1 \le m \le 16$, $1 \le n \le 16$, $1 \le p \le 16$, $1 \le q \le 16$, preferably with n=2m+1 and/or q=2p, more preferably $1 \le m \le 8$, $1 \le p \le 8$, $2 \le n \le 16$, $2 \le q \le 16$;

$R^1$ is independently selected from hydrogen, linear, branched or cyclic alkyl groups, or linear, branched or cyclic alkyl groups substituted by other atoms or groups;

D is independently selected from monodentate, bidentate, tridentate, or polydentate neutral coordinating ligand system, preferably a monodentate or a bidentate;

x is an integer, 0≤x≤4; and y is the degree of association of the molecule, 1≤y≤6.

Exemplary examples of the disclosed silicon-free lithium precursors shown in the general formula (IV) include LiNMe(CH₂CH₂OMe), LiNMe(CH₂CH₂OEt), LiNMe(CH₂CH₂OiPr) LiNMe(CH₂CH₂OtBu), LiNEt(CH₂CH₂OMe), LiNEt(CH₂CH₂OEt), LiNiPr(CH₂CH₂OMe), LiNtBu(CH₂CH₂OMe), LiNMe(CH₂CH(OMe)₂)

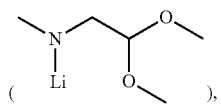

etc.

Alternatively, the disclosed silicon-free lithium precursors may be lithium dialkoxyamides, where $L^1=(C_mH_n)-OR^1$; $L^2=(C_pH_q)-OR^2$ in the formula (I), having a general formula:

$$[Li-N((C_mH_n)-OR^1)((C_pH_q)-OR^2)\text{-}D_x]_y \qquad (V)$$

wherein $C_mH_n$ and $C_pH_q$ each are independently linear, branched or cyclic alkyl groups;

m, n, p, q each are independent integers, 1≤m≤16, 1≤n≤16, 1≤p≤16, 1≤q≤16, preferably with n=2m and/or q=2p, more preferably 1≤m≤4, 1≤p≤4, 2≤n≤8, 2≤q≤8;

$R^1$ and $R^2$ each are independently selected from hydrogen, linear, branched or cyclic alkyl groups, or linear, branched or cyclic alkyl groups substituted by other atoms or groups;

D is independently selected from monodentate, bidentate, tridentate, or polydentate neutral coordinating ligand system, preferably a monodentate or a bidentate;

x is an integer, 0≤x≤4; and y is the degree of association of the molecule, 1≤y≤6.

Exemplary examples of the disclosed silicon-free lithium precursors shown in the general formula (V) include LiN(CH₂CH₂OMe)₂, LiN(CH₂CH₂OEt)₂, LiN(CH₂CH₂OiPr)₂, LiN(CH₂CH₂OtBu)₂, etc.

Alternatively, the disclosed silicon-free lithium precursors may be lithium aminoalkoxyamide complexes, where $L^1=(C_mH_n)-NR^1R^2$; $L^2=(C_pH_q)-OR^3$ in the formula (I), having a general formula:

$$[Li-N((C_mH_n)-NR^1R^2)((C_pH_q)-OR^3)\text{-}D_x]_y \qquad (VI)$$

wherein $C_mH_n$ and $C_pH_q$ each are independently linear, branched or cyclic alkyl groups;

m, n, p, q each are independent integers, 1≤m≤16, 1≤n≤16, 1≤p≤16, 1≤q≤16, preferably with n=2m and/or q=2p, more preferably 1≤m≤4, 1≤p≤4, 2≤n≤8, 2≤q≤8;

$R^1$, $R^2$ and $R^3$ are independently selected from hydrogen, linear, branched or cyclic alkyl groups, or linear, branched or cyclic alkyl groups substituted by other atoms or groups;

D is independently selected from monodentate, bidentate, tridentate, or polydentate neutral coordinating ligand system, preferably a monodentate or a bidentate;

x is an integer, 0≤x≤4; and y is the degree of association of the molecule, 1≤y≤6.

Exemplary examples of the disclosed silicon-free lithium precursors shown in the general formula (VI) include LiN(CH₂CH₂NMe₂)(CH₂CH₂OMe), LiN(CH₂CH₂NMe₂)(CH₂CH₂OEt), LiN(CH₂CH₂NMe₂)(CH₂CH₂OiPr), LiN(CH₂CH₂NMe₂)(CH₂CH₂OtBu), etc.

The disclosed silicon-free lithium precursors exhibit good volatility and thermal stability. Moreover, the disclosed silicon-free lithium precursors may be liquid or low melting point solids. The low melting point of the disclosed silicon-free lithium precursors may be <150° C., preferably less than 80° C., more preferably approximately 25° C. The disclosed silicon-free lithium precursors are convenient to use for ALD and CVD applications.

The disclosed silicon-free lithium precursors have chelating functionalities in order to decrease their melting point and increase their volatility. More specifically, nitrogen or oxygen chelating functionalities for instance were introduced as neutral donors for electronic and steric properties of the disclosed silicon-free lithium precursors. The coordination sphere of the disclosed silicon-free lithium precursors is thus more saturated and less likely to experience oligomerization. Hence, when ALD or CVD processes are targeted, the vapors of the disclosed silicon-free lithium precursors may be delivered into a deposition reactor more effectively, thereby reducing the deposition time and leading to the deposited films or islets having high uniformity and conformality.

The disclosed silicon-free lithium precursors may generally not be pyrophoric. A pyrophoric substance ignites spontaneously in air at or below 55° C. raising important safety concerns for implementation in the industry. In addition, due to the improved volatility of the disclosed silicon-free lithium precursors, delivery of the disclosed silicon-free lithium precursors without condensation and deposition of Li-containing layers using the disclosed silicon-free lithium precursors may be performed at a temperature range between 100° C. and 150° C. The properties of the disclosed silicon-free lithium precursors, such as improved volatility, allow them to deliver together with metalorganic precursor(s) into a deposition reactor, either through separate delivery systems or through the same delivery system. Formation of Li-containing films, islets or clusters on temperature-sensitive substrates such as lithium-ion battery electrodes may be performed.

To our knowledge, the use of the disclosed silicon-free lithium precursors described in the general formula (I) to (VI) in deposition processes such as CVD and ALD processes for the formation of lithium-containing layers is first disclosed herein. The disclosed silicon-free lithium precursors may be used in a chemical deposition method, such as ALD or CVD, individually or in mixtures with enantiomers or diastereoisomers, different lithium precursors, lithium precursor(s) and metal precursor(s) in solution or not in solution to form Li-containing films or islets such as Li₂O, LiOH, Li₂S, Li₃N, LiF, lithium carbonate, lithium, aluminum fluorate, lithium aluminum oxide, lithium aluminum, lithium cobalt oxide, lithium titanate, lithium zirconate, lithium niobate, LiPON, lithium phosphate, lithium borate, lithium borophosphate, lithium niobate, lithium zirconium oxides, etc.

Preferably, the disclosed silicon-free lithium precursors have suitable properties for vapor deposition methods, such as vapor pressure ranging from approximately 0.1 Torr at 23° C. to approximately 1,000 Torr at 23° C., a melting point below 20° C. (preferably being in liquid form at room temperature) and more preferably below −20° C. to prevent freeze/thaw issues, and exhibiting 0% by volume or v/v to 1% v/v decomposition per week at the temperature required to obtain a usable vapor pressure (1-100 Torr).

While the disclosed silicon-free lithium precursors are ideally liquids and vaporized in bubblers or direct liquid injection systems, the use of solid precursors for ALD/CVD precursor vaporization is also possible using sublimators such as ones disclosed in PCT Publication WO 2009/087609 to Xu et al. Alternatively, solid precursors may be mixed or dissolved in a solvent to reach a usable melting point and viscosity for usage by Direct Liquid Injection systems. While the disclosed silicon-free lithium precursors are ideally liquids, solid precursors for liquid phase deposition techniques such as spray coating, slit coating and spin on deposition, may be mixed or dissolved in a solvent to reach a usable melting point and viscosity for flowing the precursor solutions into the reactor.

To ensure process reliability, the disclosed silicon-free lithium precursors may be purified by continuous or fractional batch distillation or sublimation prior to use to a purity ranging from approximately 93% by weight or w/w to approximately 100% w/w, preferably ranging from approximately 99% w/w to approximately 99.999% w/w, more preferably, ranging from approximately 99% w/w to approximately 100% w/w. One of ordinary skill in the art will recognize that the purity may be determined by $^1$H NMR or gas or liquid chromatography with mass spectrometry. The Li-containing film, islet or cluster forming compositions may contain any of the following impurities: ammonium salts; alkylamines, dialkylamines, alkylimines, THF, ether, pentane, cyclohexane, heptanes, toluene, halogenated metal compounds. Preferably, the total quantity of these impurities is below 0.1% w/w. The purified composition may be produced by recrystallization, sublimation, distillation, and/or passing the gas or liquid through a suitable adsorbent, such as 4 Å molecular sieves.

The disclosed Li-containing film, islet or cluster forming composition contains less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by distillation of the Li-containing film, islet or cluster forming composition.

The concentration of trace metals and metalloids in the purified Li-containing film, islet or cluster forming composition may each range independently from approximately 0 ppbw to approximately 100 ppbw, and more preferably from approximately 0 ppbw to approximately 10 ppbw. These metal or metalloid impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), Vanadium (V) and Zinc (Zn). The concentration of X (where X=Cl, Br) in the purified Li-containing film, islet or cluster forming composition may range between approximately 0 ppmw and approximately 100 ppmw and more preferably between approximately 0 ppmw to approximately 10 ppmw.

Care should be taken to prevent exposure of the disclosed Li-containing film, islet or cluster forming compositions to water as the disclosed silicon-free lithium precursors are highly moisture sensitive and may be decomposed by encountering water.

Also disclosed are methods of using the disclosed Li-containing film, islet or cluster forming compositions for vapor depositions such as ALD or CVD techniques. The disclosed methods provide for the use of the Li-containing film, islet or cluster forming compositions for deposition of Li-containing films or islets. The disclosed methods may be useful in the manufacture of electrode materials in lithium-ion battery industry.

The disclosed Li-containing film, islet or cluster forming compositions may be used to deposit Li-containing films or islets using any deposition methods known to those of skill in the art. Examples of suitable deposition methods include chemical vapor deposition (CVD) or atomic layer deposition (ALD) with or without plasma treatment, or a liquid-based deposition. Exemplary CVD methods include thermal CVD, pulsed CVD (PCVD), low pressure CVD (LPCVD), sub-atmospheric CVD (SACVD) or atmospheric pressure CVD (APCVD), hot-wire CVD or hot filament CVD (also known as cat-CVD, in which a hot wire serves as an energy source for the deposition process), hot wall CVD, cold wall CVD, aerosol assisted CVD, direct liquid injection CVD, combustion CVD, hybrid physical-CVD, metalorganic CVD, rapid thermal CVD, photo-initiated CVD, laser CVD, radicals incorporated CVD, plasma enhanced CVD (PECVD) including but not limited to flowable PECVD, and combinations thereof. Exemplary ALD methods include thermal ALD, plasma enhanced ALD (PEALD), spatial isolation ALD, temporal ALD, selective or not ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control. Liquid-based deposition are exemplified by spin-on deposition (SOD), spray deposition, dip-coating, slit-coating.

The deposition methods should be chosen so as not to be harmful to the substrate due to the high energy impact of the deposited method upon the substrate. The deposition should be uniform and or conformal, and at least lead to a defect free or pinhole free layer, as it is required in different relevant industrial applications. Such applications may be as an electronic barrier between other materials or layers so that there is no electric leakage across the barrier or in some applications no physical contact between layers whom one desires to separate. It is particularly important to provide defect free layers in lithium ion battery technology wherein electrolytes allowing for the passage of lithium ions separate lithium-containing layers, but wherein no physical or electric contact should be made between the layers to avoid an irreversible reduction in the battery efficiency. The layers should provide the least ionic resistance so that the importance to control the layer quality is thus critical.

The deposition processes may be done in reactants treating flat or quasi-flat surfaces, like single-substrate, batch, roll-to-roll or spatial ALD reactors known in the art. The use of powder reactor, in combination of ALD or CVD techniques, is also increasingly considered for performing uniform coatings on batteries' electrode active materials. A vertical reaction chamber may be used so as to form a fluidized zone in which the coating reactions occur. It has been observed that the powder particles in fluidized beds tend to stick to each other forming larger particle blocks, agglomerates. In order to hinder the formation of agglomerates, a vibrating gas flow is used, a carefully selected gas flow that vibrates is hence fed into the reaction chamber. According to the principle of Helmholtz resonance, an incoming gas flow is forced over and into a cavity causing vibrations into the outgoing gas flow. The outgoing vibrating gas flow is guided into the reaction chamber in order to hinder the formation of agglomerates.

The disclosed methods for forming a Li-containing layer on a substrate include: placing a substrate in a reactor, delivering into the reactor a vapor of the disclosed Li-containing film, islet or cluster forming composition, and contacting the vapor with the substrate (and typically directing the vapor to the substrate) to form a Li-containing layer on the surface of the substrate.

The disclosed methods may include forming a bimetal-containing layer on a substrate using the vapor deposition process and, more specifically, for deposition of $LiNbO_3$, $LiZrO_x$ layers. The disclosed methods may be useful in the manufacture of lithium-ion batteries.

The vapor of the Li-containing film, islet or cluster forming composition is generated and then introduced into a reaction chamber containing a substrate. The temperature and the pressure in the reaction chamber and the temperature of the substrate are held at conditions suitable for vapor deposition of at least part of the silicon-free Li-containing precursor onto the substrate. In other words, after introduction of the vaporized composition into the reaction chamber, conditions within the reaction chamber are adjusted such that at least part of the precursor is deposited onto the substrate to form the Li-containing layer. One of ordinary skill in the art will recognize that "at least part of the precursor is deposited" means that some or all of the precursor reacts with or adheres to the substrate.

The reaction chamber or reactor may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 20 Torr for all ALD and subatmospheric CVD. Subatmospheric CVD and atmospheric CVD pressures may range up to 760 Torr (atmosphere). In addition, the temperature within the reaction chamber may range from a temperature below room temperature, such as about 0° C., to about 600° C. Preferably, the temperature within the reaction chamber may range from about 15° C. to about 600° C. More preferably, the temperature within the reaction chamber may range from about 20° C. to about 600° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to cool or heat the substrate are known in the art. The reactor wall is heated to a sufficient temperature to obtain the desired film, islet or cluster at a sufficient growth rate and with desired physical state and composition. A non-limiting exemplary temperature range to which the reactor wall may be heated includes from approximately 20° C. to approximately 600° C. Alternatively, a non-limiting exemplary temperature range to which the reactor wall may be heated includes from approximately 20° C. to approximately 1000° C. Alternatively a non-limiting exemplary temperature to which the reactor wall may be heated includes approximately 500° C. or higher. When a plasma deposition process is utilized, the deposition temperature may range from approximately 20° C. to approximately 550° C., preferably from approximately 125° C. to approximately 250° C. Alternatively, when a thermal process is performed, the deposition temperature may range from approximately 300° C. to approximately 800° C., preferably from approximately 400° C. to approximately 600° C.

Alternatively, the substrate may be heated to a sufficient temperature to obtain the desired Li-containing film at a sufficient growth rate and with desired physical state and composition. A non-limiting exemplary temperature range to which the substrate may be heated includes from room temperature to approximately 600° C. Preferably, the temperature of the substrate remains less than or equal to 500° C.

The reactor contains one or more substrates onto which the films or islets will be deposited. A substrate is generally defined as the material on which a process is conducted. The substrates may be any suitable substrate used in semiconductor or lithium battery industry. Examples of suitable substrates include wafers or supports, such as silicon, silica, glass substrates. The support may have one or more layers of differing materials deposited on it from a previous manufacturing step. For example, the supports may include silicon layers (crystalline, amorphous, porous, etc.), silicon oxide layers, silicon nitride layers, silicon oxy nitride layers, carbon doped silicon oxide (SiCOH) layers, or combinations thereof. The disclosed silicon-free Li-containing precursors used in the lithium battery industry may be deposited on powders made of graphite, doped graphite, especially Si-doped graphite, silicon and silicon alloys, or graphite made of metallic oxides (especially lithium nickel oxide, lithium nickel manganese oxide, lithium nickel cobalt oxide, lithium nickel cobalt manganese oxide, lithium nickel cobalt aluminum oxide, lithium iron phosphate, and the corresponding materials with dopants, or combinations thereof. Additionally, the wafers may include copper layers or noble metal layers (e.g. platinum, palladium, rhodium, or gold). The layers may include oxides which are used as dielectric materials in MEMS, MIM, DRAM, RF front end modules, or FeRam technologies. The underlying materials may include such as a nickel oxide, a manganese oxide, a cobalt oxide, a graphitic or amorphous carbon, etc. Plastic layers, such as poly(3,4-ethylenedioxythiophene) poly(styrenesulfonate) [PEDOT:PSS] may also be used. The layers may be planar, spherical, rounded or patterned, or may not have regular structures (see above). For example, the layer may be underlying materials made of hydrogenated carbon, for example $CH_x$, wherein x is greater than zero. The preferred underlying materials are a graphitic or amorphous carbon, a lithium nickel manganese oxide, a lithium nickel manganese cobalt oxide, a lithium nickel cobalt aluminum oxide.

The disclosed processes may deposit the Li-containing layer directly on the support or directly on one or more than one of the layers on top of the support. The substrate may be patterned or may include complex tridimensional structures. For example, a conformal Li-containing film, such as Li, may be deposited using any ALD/CVD technique having an aspect ratio ranging from approximately 20:1 to approximately 100:1. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. In many instances though, the preferred substrate utilized may be selected from hydrogenated carbons, silicon-based carbons, lithium metal oxides or Si type substrates.

The disclosed Li-containing film forming compositions may be supplied either in neat form or in a blend with a suitable solvent, such as toluene, ethyl benzene, xylene, mesitylene, decane, dodecane, octane, hexane, pentane, tertiary amines, acetone, tetrahydrofuran, ethanol, ethylmethylketone, 1,4-dioxane, or others. The disclosed compositions may be present in varying concentrations in the solvent. For example, the resulting concentration may range from approximately 0.05 M to approximately 2 M.

The neat or blended Li-containing film, islet or cluster forming compositions are delivered into a reactor in vapor form by conventional means, such as tubing and/or flow meters. The composition in vapor form may be produced by vaporizing the neat or blended composition through a conventional vaporization step such as direct vaporization, distillation, by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling of the carrier gas into the composition. The carrier gas may include, but is not limited to, Ar, He, or $N_2$, and mixtures thereof. Bubbling with a carrier gas may also remove any dissolved oxygen present in the neat or blended composition. The carrier gas and composition are then introduced into the reactor as a vapor.

If necessary, the container may be heated to a temperature that permits the Li-containing film forming composition to be in its liquid phase and to have a sufficient vapor pressure. The container may be maintained at temperatures in the range of, for example, 0-150° C. Those skilled in the art recognize that the temperature of the container may be adjusted in a known manner to control the amount of Li-containing film forming composition vaporized.

In addition to the disclosed silicon-free lithium precursors, a reactant or a co-reactant may also be introduced into the reactor. The co-reactant may be an oxygen-containing gas for Li-containing film deposition. The oxygen-containing gas includes, but is not limited to, oxidizers such as, $O_3$, $O_2$, $H_2O$, trimethylphosphate, an alkylphosphate, an alkylphosphimine, NO, $N_2O$, $H_2O_2$, O radicals, or combinations thereof, preferably $O_3$ or $O_2$. Typically, $O_3/O_2$ mixtures are used for high temperature (e.g. approximately 500° C. or higher) oxide deposition. In addition, the co-reactant may be $N_2$, $NH_3$, $N_2H_4$, or an alkylhydrazine.

The disclosed vapor deposition processes (e.g., ALD, CVD) typically include a step to remove excess co-reactant from the deposition surface by providing a purge step, either by purging a reactor with an inert gas, or passing the substrate in a sector under high vacuum and/or a carrier gas curtain.

The co-reactants listed above may be treated by plasma, in order to decompose the co-reactant into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

When the desired Li-containing film also contains another element, for example and without limitation, P, Ga, Ge, As, B, Ta, Hf, Nb, Mg, Al, Sr, Y, Ba, Ca, As, Sb, Bi, Sn, Pb, Co, Ni, Fe, Mn, lanthanides, or combinations thereof, the co-reactants may include another precursor which is selected from, but not limited to, trimethylphosphate, an alkylphosphate, an alkylphosphimine.

The disclosed Li-containing film, islet or cluster forming composition and one or more co-reactants may be introduced into the reaction chamber simultaneously (e.g., CVD), sequentially (e.g., ALD), or in other combinations. For example, the Li-containing film, islet or cluster forming composition may be introduced in one pulse and two additional reactants may be introduced together in a separate pulse (e.g., modified ALD). Alternatively, the reaction chamber may already contain the co-reactant prior to introduction of the disclosed Li-containing film, islet or cluster forming composition. The co-reactant may be passed through a plasma system localized or remotely from the reaction chamber, and decomposed to radicals. Alternatively, the Li-containing film, islet or cluster forming composition may be introduced to the reaction chamber continuously while other reactants are introduced by pulse (e.g., pulsed-CVD). In each example, a pulse may be followed by a purge or evacuation step to remove excess amounts of the component introduced. Each pulse of the disclosed Li-containing film, islet or cluster forming composition may last for a time period ranging from about 0.01 seconds to about 200 seconds, alternatively from about 1 seconds to about 180 seconds, alternatively from about 10 seconds to about 160 seconds. The co-reactant may also be pulsed into the reactor. In such embodiments, the pulse of each co-reactant may last for a time period ranging from about 0.01 seconds to about 120 seconds, alternatively from about 1 seconds to about 30 seconds, alternatively from about 2 seconds to about 20 seconds. In each example, the pulse of purge may last for a time period ranging from about 0.01 s to about 50 s, alternatively from about 0.3 s to about 30 s, alternatively from about 1 s to about 20 s, alternatively from about 2 s to about 10 s. In another alternative, the Li-containing film, islet or cluster forming composition and one or more co-reactants may be simultaneously sprayed from a shower head (without mixing of the composition and the reactant) under which a susceptor holding several substrates is spun (e.g., spatial ALD).

In one non-limiting exemplary ALD type process, the vapor phase of a Li-containing film, islet or cluster forming composition is introduced into the reaction chamber, where at least part of the silicon-free Li-containing precursor reacts with a suitable substrate, such as Si, $SiO_2$, $Al_2O_3$, etc., to form an adsorbed Li-containing layer or islet. Excess composition may then be removed from the reaction chamber by purging and/or evacuating the reaction chamber. $H_2$ or $NH_3$ is introduced into the reaction chamber where it reacts with the adsorbed Li-containing layer in a self-limiting manner. Any excess H or $NH_3$ is removed from the reaction chamber by purging and/or evacuating the reaction chamber. If the desired film is a $Li_3N$ film, this two-step process may provide the desired film thickness or may be repeated until a film having the necessary thickness has been obtained.

Alternatively, if the desired Li-containing film, islet or cluster contains a second element (i.e., LiM, where M is P, Ga, Ge, As, B, Ta, Hf, Nb, Mg, Al, Sr, Y, Ba, Ca, As, Sb, Bi, Sn, Pb, Co, lanthanides, or combinations thereof), the two-step process above may be followed by introduction of a vapor of a second precursor into the reaction chamber. The second precursor will be selected based on the nature of the LiM film, islet or cluster being deposited. After introduction into the reaction chamber, the second precursor is contacted with the substrate. Any excess second precursor is removed from the reaction chamber by purging and/or evacuating the reaction chamber. Once again, $H_2$ or $NH_3$ may be introduced into the reaction chamber to react with the second precursor. Excess $H_2$ or $NH_3$ is removed from the reaction chamber by purging and/or evacuating the reaction chamber. If a desired film, islet or cluster thickness has been achieved, the process may be terminated. However, if a thicker film, islet or cluster is desired, the entire four-step process may be repeated. By alternating the provision of the silicon-free Li-containing precursor, second precursor, and $H_2$ or $NH_3$, a film of desired composition and thickness may be deposited.

The disclosed silicon-free lithium precursors may contain any of the following impurities: undesired co-generic species; solvents; chlorinated metal compounds; or other reaction products. In one alternative, the total quantity of these impurities is below 0.1% w/w.

Solvents, such as hexane, pentane, dimethyl ether, or anisole, may be used in the precursor's synthesis. The concentration of the solvent in the disclosed Si-containing precursors may range from approximately 0% w/w to approximately 5% w/w, preferably from approximately 0% w/w to approximately 0.1% w/w. Separation of the solvents from the precursor may be difficult if both have similar boiling points. Cooling the mixture may produce solid precursor in liquid solvent, which may be separated by filtration. Vacuum distillation may also be used, provided the precursor product is not heated above approximately its decomposition point.

In one alternative, the disclosed silicon-free lithium precursors contain less than 5% v/v, preferably less than 1% v/v, more preferably less than 0.1% v/v, and even more preferably less than 0.01% v/v of any of its undesired co generic species, reactants, or other reaction products. This alternative may provide better process repeatability. This alternative may be produced by distillation of the disclosed silicon-free lithium precursors.

In another alternative, the disclosed silicon-free lithium precursors may contain between 5% v/v and 50% v/v of one or more of congeneric Li-containing precursors, reactants, or other reaction products, particularly when the mixture provides improved process parameters or isolation of the target compound is too difficult or expensive. For example, a mixture of two Li-containing precursors may produce a stable, liquid mixture suitable for vapor deposition.

Also disclosed are methods or processes for forming Li-containing layers on a substrate using an ALD or CVD process in a reaction chamber. The disclosed silicon-free lithium precursors may be used to deposit Li-containing films or islets using ALD or CVD methods known to those of skill in the art.

The disclosed vapor deposition processes (e.g., ALD, CVD) using the disclosed silicon-free lithium precursors may be performed for substrates having a temperature of approximately room temperature or higher, preferably approximately 100° C. or higher, more preferably approximately 200° C. or higher. The disclosed ALD processes using the disclosed Li-containing precursors may be performed for substrates having a temperature range from approximately room temperature to approximately 750° C., more preferably from 50° C. to approximately 500° C., even more preferably from 100° C. to approximately 250° C.

The substrate exposure time in the disclosed vapor deposition processes (e.g., ALD, CVD) using the disclosed precursors may range from 1 millisecond to 5 minutes, preferably from 1 second to 60 seconds. The co-reactant exposure time in the disclosed ALD processes using the disclosed precursors may range from 1 millisecond to 1 minute, preferably from 100 milliseconds to 30 seconds.

The pressure in the reaction chamber is held at conditions suitable for the precursor to react with the surface. For instance, the pressure in the chamber may be held between approximately 0.1 mTorr and approximately 1000 Torr, preferably between approximately 0.1 Torr and approximately 400 Torr, more preferably between approximately 1 Torr and approximately 100 Torr, even more preferably between approximately 1 Torr and approximately 10 Torr.

The disclosed silicon-free lithium precursors and the co-reactants may be introduced into the reactor either sequentially (ALD) or simultaneously (CVD). The reactor may be purged with an inert gas between the introduction of the precursor and the introduction of the co-reactant. Alternatively, the substrate may be moved from one area for precursor exposure to another area for co-reactant exposure (Spatial ALD).

Depending on the particular process parameters, deposition may take place for a varying length of time. Generally, deposition may be allowed to continue as long as desired or necessary to produce a film with the necessary thickness. Typical film thicknesses may vary from an atomic monolayer to several hundreds of microns, depending on the specific deposition process, preferably between 0.5 and 100 nm, more preferably between 1 and 50 nm. The deposition process may also be performed as many times as necessary to obtain the desired film.

In one non-limiting exemplary ALD type process, the vapor phase of the disclosed silicon-free lithium precursor is introduced into the reactor, where the Li-containing precursor physi- or chemisorbs on the substrate. Excess composition may then be removed from the reactor by purging and/or evacuating the reactor. A desired gas (for example, $O_3$) is introduced into the reactor where it reacts with the physi- or chemisorped precursor in a self-limiting manner. Any excess reducing gas is removed from the reactor by purging and/or evacuating the reactor. If the desired film is a Li-containing film, this two-step process may provide the desired film thickness or may be repeated until a film having the necessary thickness has been obtained.

The Li-containing films or islets formed by the disclosed silicon free Li-containing precursors through vapor deposition process include $Li_2O$, LiOH, $Li_2S$, $Li_3N$, LiF, lithium carbonate, lithium, aluminum fluorate, lithium aluminum oxide, lithium aluminum, lithium cobalt oxide, lithium titanate, lithium zirconate, lithium niobate, UPON, lithium phosphate, lithium borate, lithium borophosphate, etc.

The disclosed silicon-free lithium precursors have the following advantages. The disclosed silicon-free lithium precursors do not contain silicon. Although silicon-containing lithium precursors, such as the most common precursor LiHMDS, e.g., $Li(SiMe_3)_2$, is quite stable and sufficiently volatile, silicon would remain in part in the deposited film. The presence of silicon may be a problem when forming materials such as $LiTiO_3$, $LiNbO_3$ or LiZrOx where silicon may lead to adverse electrochemical features, linked to the induced disorder of the material, and hence lower ionic conductivity.

The disclosed silicon-free lithium precursors are high melting point and low volatility lithium sources. Lithium compounds exist as various aggregates in solution and in the solid state. These molecules have commonly multimeric structures, typically trimeric or tetrameric, leading to high molecular weight, high melting point and low volatility. For example, n-BuLi is tetrameric in diethyl ether and hexameric in cyclohexane. $Li(SiMe_3)_2$ is reported as a trimer in solid state, LiOtBu is said to evolve as a hexamer. The use of liquid or low melting point solid precursors is well known in the industry, especially semiconductor industry. In addition, these precursors are convenient, so that the flow rate may be measured and/or controlled accurately. When precursors are not very volatile and thus need to be heated, the way to deliver the precursor is to heat only a portion of the precursor in a tank so that it will be delivered quickly, and the rest of the precursor is kept in ambient conditions in the tank called a "mother tank". It is then important to feed the heated tank in a practical way. Liquids or low melting point solids may be transfilled with simple valve opening. The melting point should be thus significantly lower than Li(OtBu) or Li(SiMe$_3$)$_2$, e.g. below 150° C., preferably lower 80° C., most preferably lower than 25° C. Furthermore, the delivery of stable feed rates of high melting point solid is a challenge, considering their changes of morphology: small particles, typically with a higher surface to bulk ratio, are consumed faster than bigger particles. On the contrary, particles may merge, making the feed rate potentially unstable. The disclosed silicon-free lithium precursors having low melting point could overcome these issues.

The disclosed silicon-free lithium precursors are highly moisture sensitive and pyrophoric lithium precursors. One of the well-known lithium sources are organolithium compounds such as alkyl lithium and lithium amides. They are usually highly reactive, moisture sensitive and sometimes pyrophoric species. Special safety requirements are necessary. They are usually commercially available in solution. Whereas the disclosed silicon-free lithium precursors may require less special safety requirements than organolithium compounds as lithium precursor source.

Known ALD/CVD processes for lithium-containing film formation proceed at temperatures typically between 250° C. and 350° C. This temperature range may be acceptable if the depositions occur on components, such as powders of active materials. This temperature range may not be suitable for deposition on temperature sensitive materials such as lithium-ion battery electrodes. The disclosed silicon-free lithium precursors are liquid below 150° C., preferably liquid at 50° C., more preferably liquid at 25° C., which is suitable for deposition on temperature sensitive materials such as lithium-ion battery electrodes.

Whether CVD, ALD or other film coating/deposition techniques are used, the industry looks for a cost-effective deposition technique. The co-injection of lithium and metal precursors in the reactor is preferred to minimize the process time. This would require the use of chemically compatible lithium and metal precursors, if they are introduced together. The disclosed silicon-free lithium precursors would meet these requirements.

Other applications of interest for the use of lithium precursors include the formation of Li-containing clusters or islets. In some cases, only a small amount of Li-containing materials, in the form of islets or clusters, e.g. non-continuous deposits, are enough to improve the electrochemical behavior of the materials. In photovoltaic applications or semiconductor applications, traces of lithium on the surface are also known to favor the crystal growth of the materials aimed to be deposited such as copper indium gallium selenide (CIGS), copper zinc tin sulfide (CZTS) absorbing layers, 2D-materials such as molybdenum or tungsten chalcogenides, leading to crystallites of much greater size, hence dramatically improving their physical properties, especially their electronic properties such as carrier mobility. These traces of lithium may be formed of islets or clusters using gas phase deposition techniques for instance.

EXAMPLES

The following non-limiting examples are provided to further illustrate embodiments of the invention. However, the examples are not intended to be all inclusive and are not intended to limit the scope of the inventions described herein.

In the following Examples 9-13, deposition experiments were carried out under the following conditions.

Reactor temperature: from 0° C. to 600° C.;
Reactor pressure: 1 Torr;
Lithium precursor canister temperature: 110° C.;
Lithium precursor canister pressure: 20 Torr;
Flow rate of N$_2$ bubbling of the Lithium precursor: 40 sccm;
Trimethylphosphate (TMPO) canister temperature: 80° C.;
TMPO canister pressure: 20 Torr;
Flow rate of N$_2$ bubbling of TMPO: 40 sccm;
Substrate: Si or TiN;
Deposition method: ALD;
Number of cycles: 200; and
Pulse conditions in a cycle: lithium precursor: 60 s or 160 s; purge: 20 s; TMPO: 10 s; purge: 30 s; O$_3$: 5 s; purge: 5 s.

The deposited film composition was studied by X-Ray Photoelectron Spectroscopy (XPS) and refractive index (RI).

Example 1: Synthesis of LiN(CHCH$_2$NMe$_2$)$_2$

Figure 2:
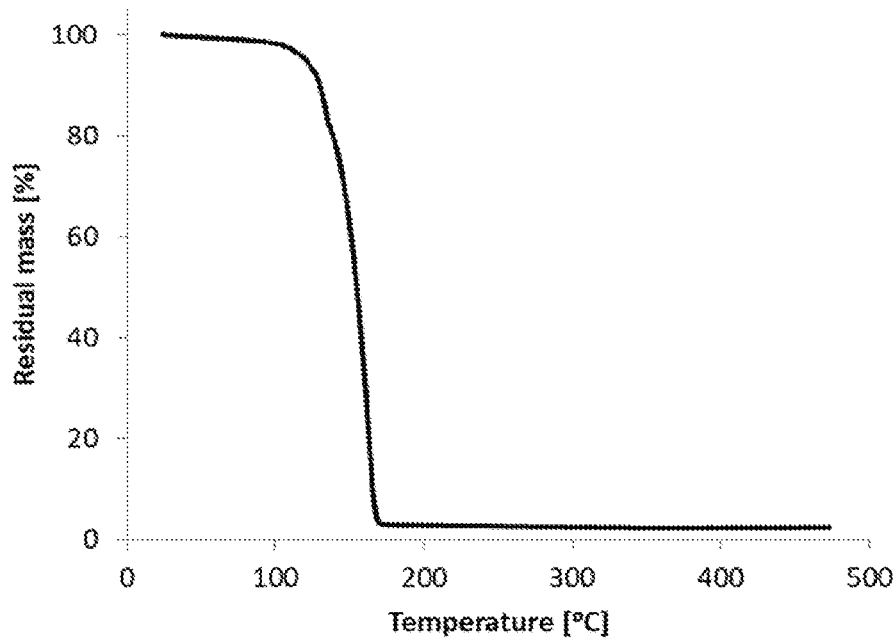
FIG. 2 is a graph of the TGA (15 Torr) of $LiN(CH_2CH_2NMe_2)_2$.

In a 100 mL flask, N(CH$_2$CH$_2$NMe$_2$)$_3$ (5.11 g, 22.0 mmol) was dissolved in pentane (200 mL). A solution of tBuLi in pentane (1.9 M, 11.6 mL, 22 mmol) was added dropwise to the flask at −78° C. After stirring at room temperature for 1 hour, all volatiles were removed under reduced pressure to obtain a yellow powder of the LiN(CH$_2$CH$_2$NMe$_2$)$_2$ (3.40 g as a crude powder). Then the solid was dissolved in a small amount of pentane (ca. 10 mL). The resulting solution was cooled at −30° C. to obtain yellow crystalline solid of the LiN(CH$_2$CH$_2$NMe$_2$)$_2$ (2.90 g, 17.6 mmol 79% yield). The yellow crystalline solid may be further purified by sublimation under dynamic vacuum at 100° C. $^1$H NMR (C$_6$D$_6$, 400 MHz) was measured at 1.80-2.20 ppm (in, 12H), 2.20-2.30 ppm (m, 2H), 3.05-3.20 ppm (m, 2H), 3.40-3.50 ppm (n, 2H). FIG. 1 shows the graph of the thermogravimetric analysis (TGA) (760 Torr) of LiN(CH$_2$CH$_2$NMe$_2$)$_2$ illustrating the weight loss vs. temperature in conditions representative of delivery conditions (10° C./min). FIG. 2 shows the graph of the TGA (15 Torr) of LiN(CH$_2$CH$_2$NMe$_2$)$_2$ illustrating the weight loss vs. temperature in conditions representative of delivery conditions (10° C./min).

Example 2: Synthesis of LiN(CHMeCH$_2$NMe$_2$)(CH$_2$CH$_2$NMe$_2$)

Figure 3:
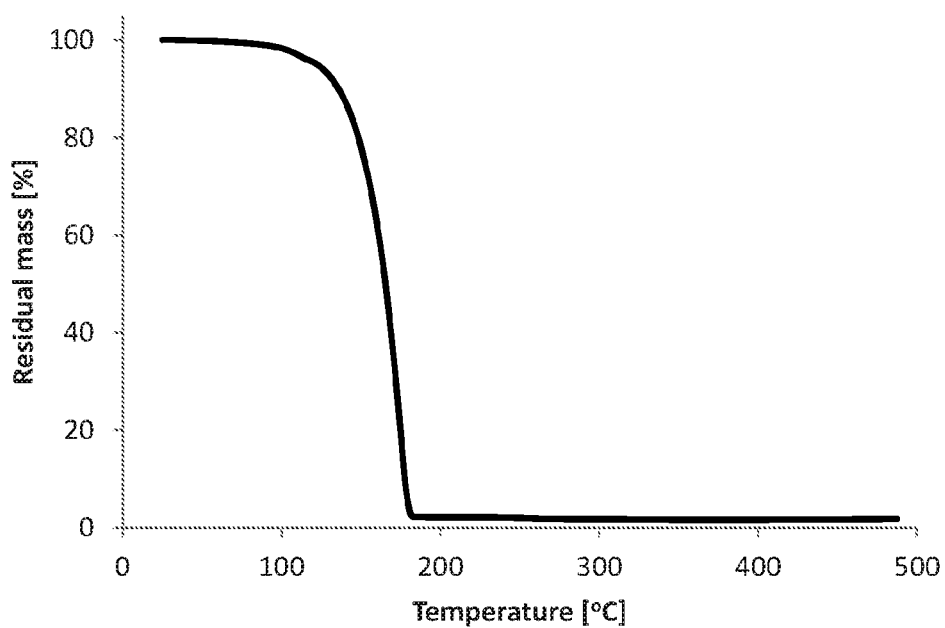
FIG. 3 is a graph of the TGA (15 Torr) of $LiN(CHMeCH_2NMe_2)(CH_2CH_2NMe_2)$.

In a 100 mL Schlenk tube, HN(CHMeCH$_2$NMe$_2$)(CH$_2$CH$_2$NMe$_2$) (1.34 g, 7.70 mmol) was dissolved in pentane (20 mL). At 0° C., a solution of nBuLi in hexane (1.6 M, 4.6 mL, 7.7 mmol) was added dropwise. After the reaction mixture was stirred at room temperature for 1 hour, all volatiles were removed under reduced pressure to give the crude compound of LiN(CHMeCH$_2$NMe$_2$)(CH$_2$CH$_2$NMe$_2$) (1.37 g, quantitative yield). The compound was purified by recrystallization from a pentane solution at −30° C. FIG. 3 shows the graph of the thermogravimetric analysis (top: 760 Torr: bottom: 15 Torr) of LiN(CHMeCH$_2$NMe$_2$)(CH$_2$CH$_2$NMe$_2$) illustrating the weight loss vs. temperature in conditions representative of delivery conditions (100/min).

Example 3: Synthesis of LiN(CH$_2$CH$_2$NEt$_2$)$_2$

Figure 4:
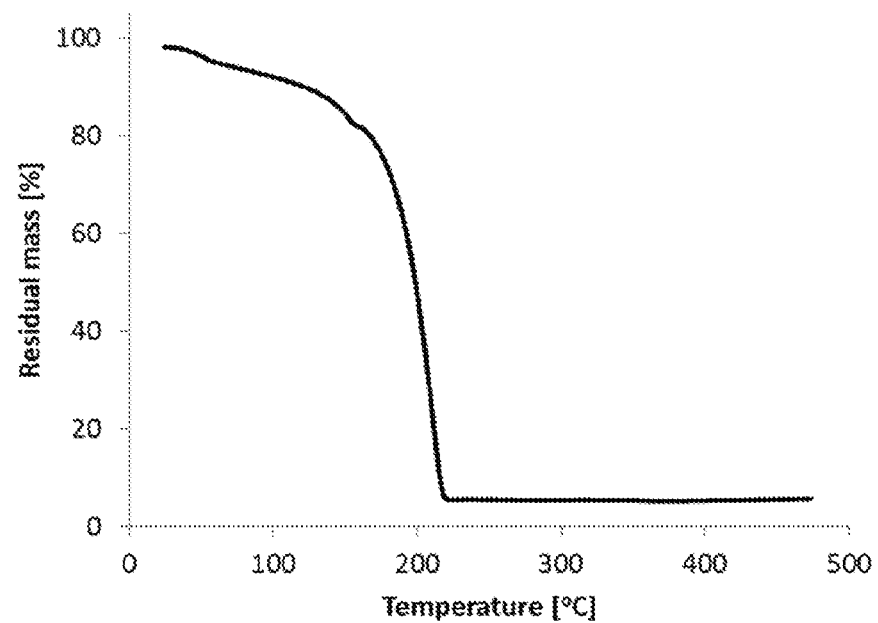
FIG. 4 is a graph of the TGA (15 Torr) of $LiN(CH_2CH_2NEt_2)_2$.

In a 100 mL Schlenk tube, HN(CH$_2$CH$_2$NEt$_2$)$_2$ (3.92 g, 18.2 mmol) was dissolved in pentane (30 mL). At 0° C., a solution of nBuLi in hexane (1.6 M, 11.4 mL, 18.2 mmol) was added dropwise. After the reaction mixture was stirred at room temperature for 1 hour, all volatiles were removed under reduced pressure to obtain the crude compound of LiN(CH$_2$CH$_2$NEt$_2$)$_2$ (4.01 g, quantitative yield). The crude compound was purified by recrystallization from a pentane solution at −30° C. $^1$H NMR (C$_6$D$_6$, 400 MHz) was measured at 0.95 ppm (t, 12H), 2.3-3.2 ppm (m, 12H), 3.38 ppm (t, 4H). FIG. 4 shows the graph of the TGA (15 Torr) of LiN(CH$_2$CH$_2$NEt$_2$)$_2$ illustrating the weight loss vs. temperature in conditions representative of delivery conditions (10° C./min).

Example 4: Synthesis of LiNMe(CH$_2$CH$_2$NMe$_2$)

Figure 5:
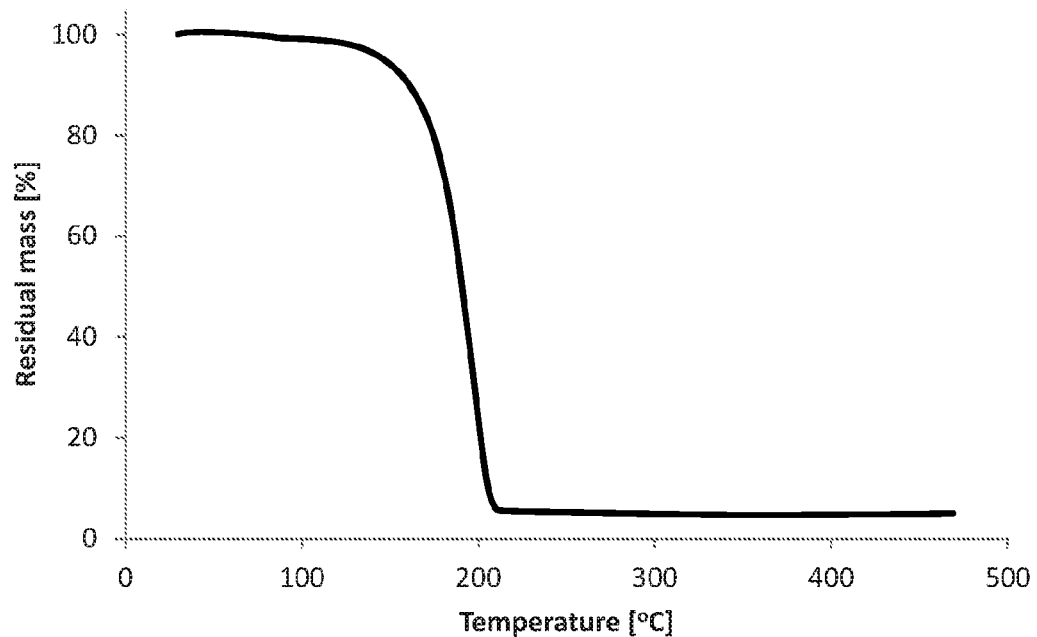
FIG. 5 is a graph of the TGA (15 Torr) of $LiNMe(CH_2CH_2NMe_2)_2$.

In a 500 mL flask, N,N,N'-trimethylethylenediamine (11.7 g, 114 mmol) was dissolved in pentane (250 mL). At 0° C., a solution of nBuLi in pentane (1.6 M, hexane, 71 mL, 114 mmol) was added to the flask. After stirring at room temperature for 1 hour, all volatiles were removed under reduced pressure to obtain white solid of LiNMe(CH$_2$CH$_2$NMe$_2$) (12.3 g, 113 mmol 99% yield). The white solid was crystallized from a pentane solution at −30° C. $^1$H NMR (C$_6$D$_6$, 400 MHz) was measured at 1.99 ppm (brs, 6H), 2.44 ppm (t, 2H), 3.10 (brs, 3H), 3.20 (brs, 2H). FIG. 5 shows the graph of the TGA (15 Torr) of LiNMe(CH$_2$CH$_2$NMe$_2$)$_2$ illustrating the weight loss vs. temperature in conditions representative of delivery conditions (10° C./min).

Example 5: Synthesis of LiNtBu(CH$_2$CH$_2$NMe$_2$)

Figure 6:
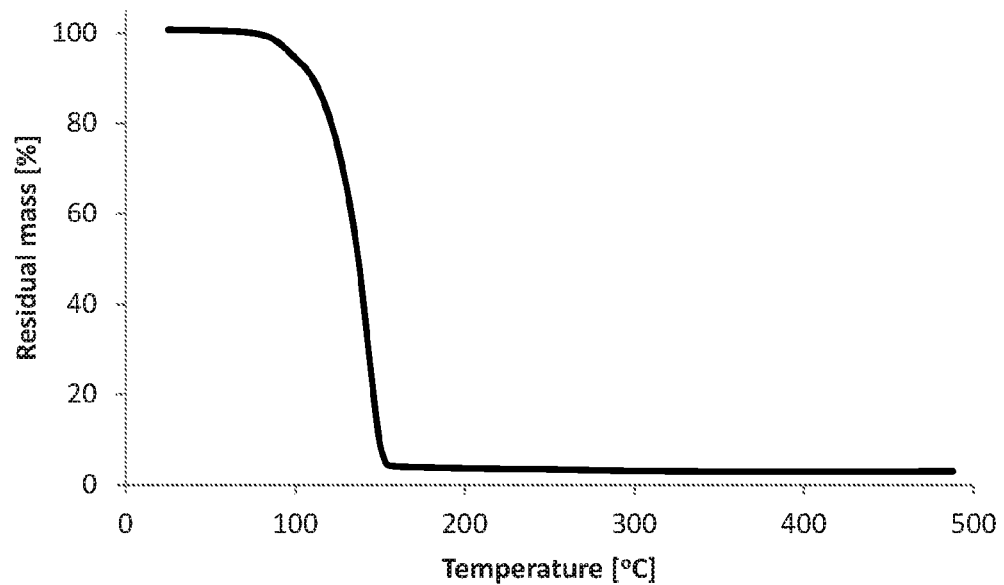
FIG. 6 is a graph of the TGA (15 Torr) of $LiNtBu(CH_2CH_2NMe_2)$.

In a 100 mL Schlenk tube, HNtBu(CH$_2$CH$_2$NMe$_2$) (4.58 g, 31.7 mmol) was dissolved in pentane (50 mL). At 0° C., a solution of nBuLi in hexane (1.6 M, 19.8 mL, 31.7 mmol) was added dropwise. After the reaction mixture was stirred at room temperature for 1 hour, all volatiles were removed under reduced pressure to obtain the crude compound of LiNtBu(CH$_2$CH$_2$NMe$_2$) (4.07 g, quantitative yield). The crude compound was purified by recrystallization from a pentane solution at −30° C. $^1$H NMR (C$_6$D$_6$, 400 MHz) was measured at 1.33 ppm (s, 9H), 1.95 (s, 6H), 2.3-2.5 (brs, 2H), 3.2 (t, 2H). FIG. 6 shows the graph of the TGA (15 Torr) of LiNtBu(CH$_2$CH$_2$NMe$_2$) illustrating the weight loss vs. temperature in conditions representative of delivery conditions (10° C./min).

Example 6: Synthesis of a Mixture of HNtBu(CHMeCH$_2$NMe$_2$) and HNtBu(CH$_2$CHMeNMe$_2$) (6.5:1)

In a 2 L flask, tBuNH$_2$ (600 mL, 5.70 mol) was dissolved in deionized water (400 mL). A solution of 2-chlorodimethylaminopropane hydrochloride (300 g, 1.90 mol) in deionized water (400 mL) was slowly added to the flask under cooling with an ice bath. The reaction solution was stirred at room temperature overnight. A solution of NaOH (153 g, 3.82 mol) in deionized water (300 mL) was slowly added. The water phase was divided into 4 portions. Each portion was extracted with pentane (100 mL×5). After dried over MgSO$_4$, the organic phase was evaporated under reduced pressure to obtain crude liquid. The crude liquid was distilled under static vacuum to remove the dissolved solid. Fractional distillation (65° C., 10 kPa) to the liquid was conducted to obtain a colorless liquid of HNtBu(CHMeCH$_2$NMe$_2$) and HNtBu(CH$_2$CHMeNMe$_2$) (6.5:1) (175 g, 58% yield). $^1$H NMR (C$_6$D$_6$, 400 MHz) of HNtBu(CHMeCH$_2$NMe$_2$) was measured under 0.78 ppm (d, 3H), 1.09 ppm (s, 9H), 1.39 ppm (brs, 1H), 2.08 ppm (s, 6H), 2.39 ppm (m, 1H), 2.50 ppm (m, 1H), 2.71 ppm (m, 1H). $^1$H NMR (CD, 400 MHz) of HNtBu(CH$_2$CHMeNMe$_2$) was measured under 1.07 ppm (d, 3H), 1.11 ppm (s, 9H), 1.60 ppm (brs, 1H), 1.88 ppm (m, 1H), 2.03 ppm (s, 6H), 2.12 ppm (m, 1H), 2.78 ppm (m, 1H).

Example 7: Synthesis of a Mixture of LiNtBu(CHMeCH$_2$NMe$_2$) and LiNtBu(CH$_2$CHMeNMe$_2$) (6.5:1)

Figure 7:
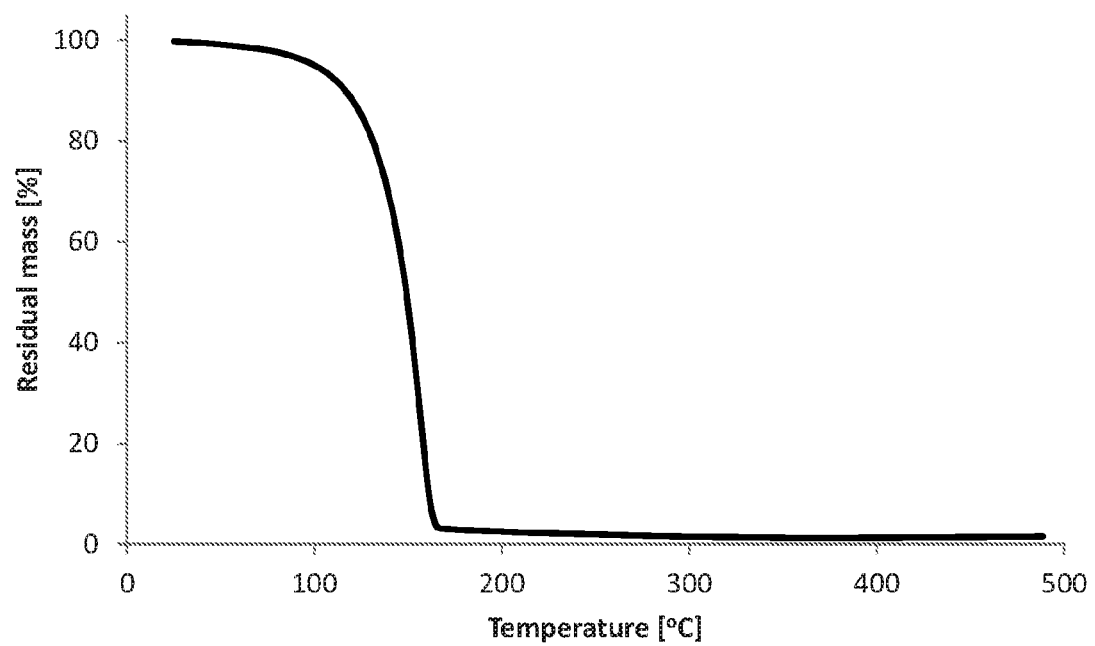
FIG. 7 is a graph of the TGA (15 Torr) of the mixture of $LiNtBu(CHMeCH_2NMe_2)$ and $LiNtBu(CH_2CHMeNMe_2)$ (6.5:1)
Figure 8:
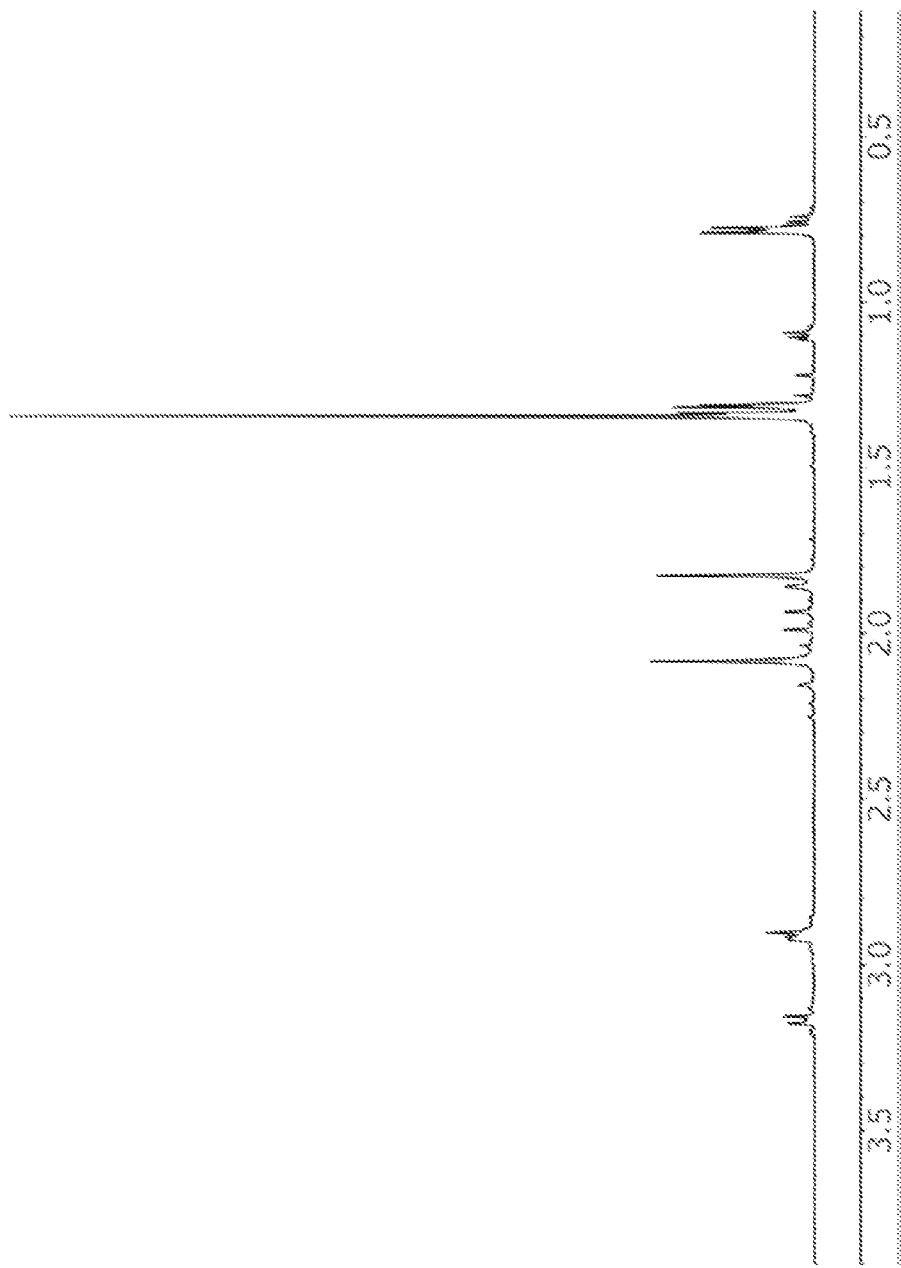
FIG. 8 is $^1H$ NMR Spectrum of the mixture of LiNtBu $(CHMeCH_2NMe_2)$ and $LiNtBu(CH_2CHMeNMe_2)$ in $C_LD_6$.

In a 500 mL flask, a mixture of HNtBu(CHMeCH$_2$NMe$_2$) and LiNtBu(CH$_2$CHMeNMe$_2$) (ratio; 6.5:1, 70.9 g, 448 mmol) was dissolved in pentane (100 mL). At 0° C., a solution of nBuLi in hexane (1.6 M, 280 mL, 448 mmol) was added dropwise. After the reaction mixture was stirred at room temperature for 1 hour, solvents were removed under reduced pressure to give yellow crude liquid (quantitative yield). The liquid was distilled under dynamic vacuum at 100° C. to obtain slightly yellow liquid of a mixture of LiNtBu(CHMeCH$_2$NMe$_2$) and LiNtBu(CH$_2$CHMeNMe$_2$) (66.8 g, 407 mmol, 91% yield). FIG. 7 shows the graph of the TGA (15 Torr) of LiNtBu(CHMeCH$_2$NMe$_2$) and LiNtBu(CH$_2$CHMeNMe$_2$) (6.5:1) illustrating the weight loss vs. temperature in conditions representative of delivery conditions (10° C./min). FIG. 8 is °H NMR Spectrum of the mixture of LiNtBu(CHMeCH$_2$NMe$_2$) and LiNtBu(CH$_2$CHMeNMe$_2$) in C$_B$Dc.

Example 8: Deposition of Lithium Phosphate

Li-containing films were deposited by ALD on silicon substrates using LiN(CH$_2$CH$_2$NMe$_2$)$_2$ and trimethylphosphate (TMPO) in a sequential mode using a cyclic mode as follows: LiN(CH$_2$CH$_2$NMe$_2$)$_2$ was pulsed during 10 s at a flow rate of 1.2 sccm. N$_2$ was flown for 30 s to purge the excess of LiN(CH$_2$CH$_2$NMe$_2$)$_2$. TMPO was pulsed during 10 s at a flow rate of 5 sccm. The number of cycles is 200. The temperature and pressure conditions were set at 250° C. and 2 Torr. With those conditions, a film of about 60 Å was deposited, implying a growth rate of 0.4 Å per cycle. The formed film has a refractive index of about 1.50. The film composition measured by XPS is determined to be about Li$_{3.1}$PO$_{4.7}$, corresponding to a targeted range of material composition.

Example 9: ALD of Li$_3$PO$_4$ Film Using LiN(CH$_2$CH$_2$NMe$_2$)$_2$ from 125° C. to 250° C.

Figure 9:
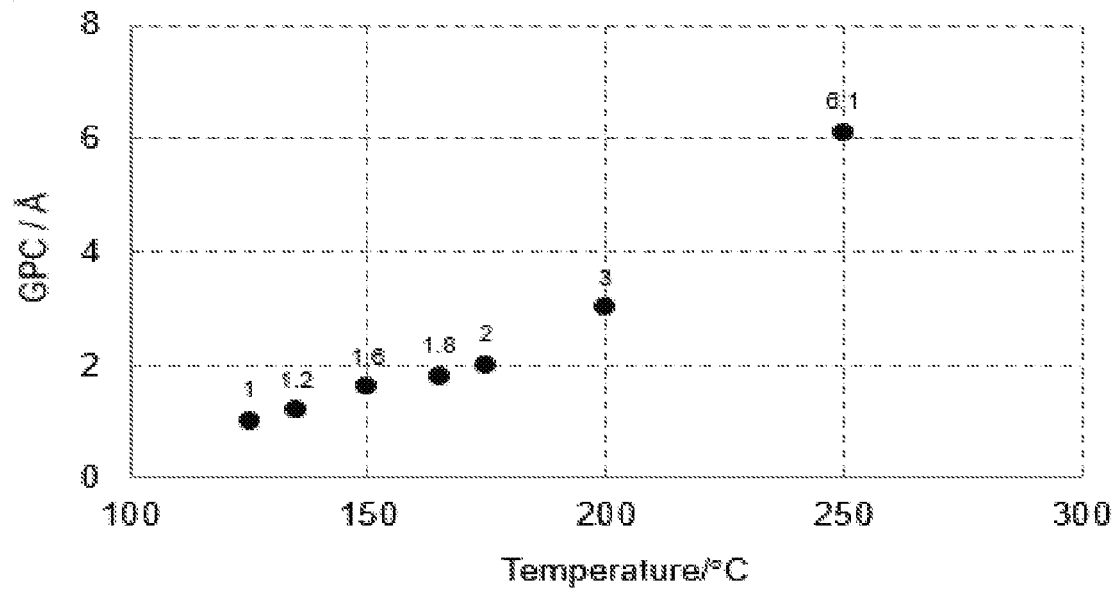
FIG. 9 is Growth per cycle (GPC) results at the temperatures from 125° C. to 250° C.
Figure 10:
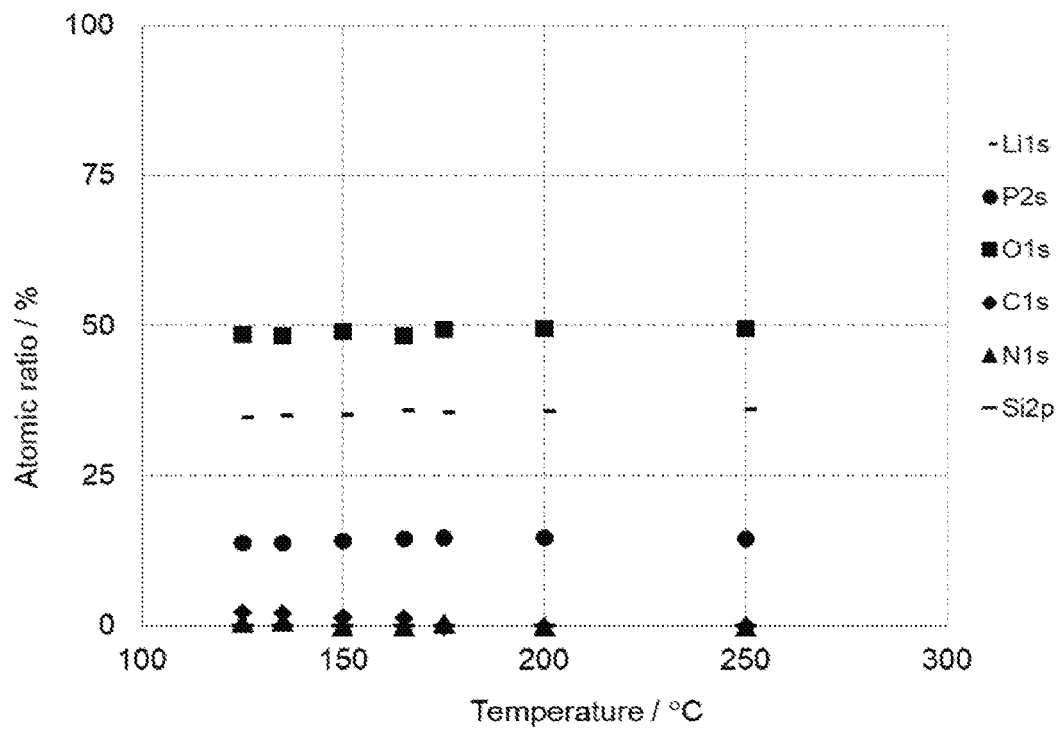
FIG. 10 is XPS results of the deposited $Li_3PO_4$ film at the temperatures from 125° C. to 250° C.
Figure 11:
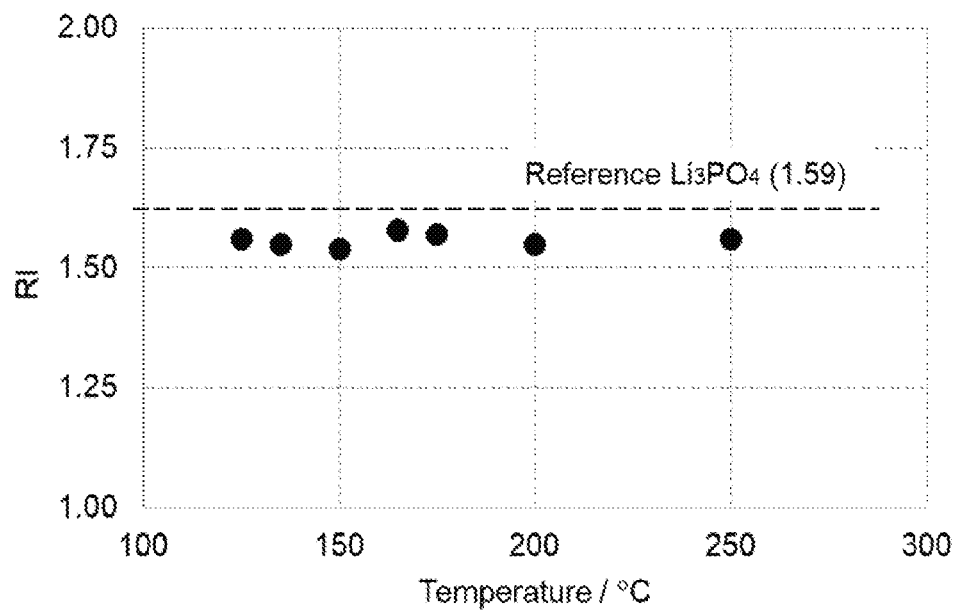
FIG. 11 is refractive index (RI) results of the deposited $Li_3PO_4$ film at the temperatures from 125° C. to 250° C. with $O_3$.

The Li$_3$PO$_4$ film was deposited by ALD using LiN(CH$_2$CH$_2$NMe$_2$)$_2$, trimethyl phosphate (TMPO) and ozone (O$_3$) at a temperature ranging from 125° C. to 250° C. on a Si wafer using a fluidized bed reactor after 200 ALD cycles. The pulse of LiN(CH$_2$CH$_2$NMe$_2$)$_2$ was 60 s. FIG. 9 is growth per cycle (GPC) at the temperatures from 125° C. to 250° C. The reactor temperature varies from 125° C. to 250° C. FIG. 10 is XPS results of the deposited Li$_3$PO$_4$ film. Based on XPS analyses, the film deposited in these conditions leads to a relatively constant atomic percentage at a wide range of temperature, e.g. Li: 34.6%, P: 13.9%, O: 48.6%, C: 2.3%, N: 0.6% at 125° C. In addition, refractive index is 1.56, see FIG. 11, which is close to that (1.59) of bulk $Li_3PO_4$. Thus, under these conditions, the material deposited is thus a lithium phosphate, $Li_3PO_4$. The $Li_3PO_4$ film growth at low deposition temperature (e.g., <200° C.) is quite unexpected and has never been reported to our knowledge. Above 200° C., the GPC reaches above 3 Å, a thickness inconsistent with a self-saturation and ALD process. However, the process may be of interest as long as the resulting $Li_3PO_4$ layer provides an effective interface between the electrolyte and the electrode material that is said to catalyze the decomposition of the electrolyte at extreme voltages.

Example 10: ALD of $Li_3PO_4$ Film Using LiN$(CH_2CH_2NMe_2)_2$ at 150° C.

Figure 12:
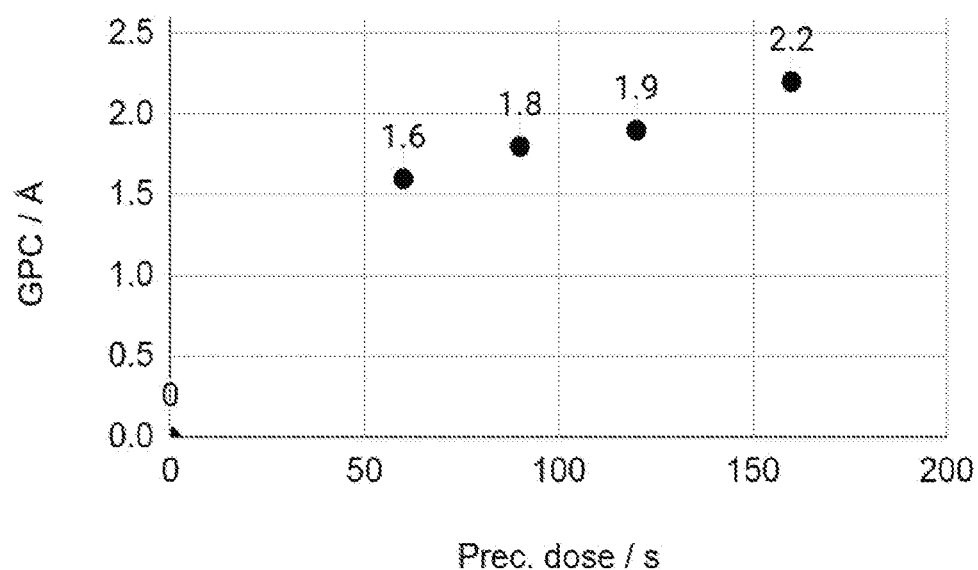
FIG. 12 is GPC results at 150° C. with $O_3$.
Figure 13:
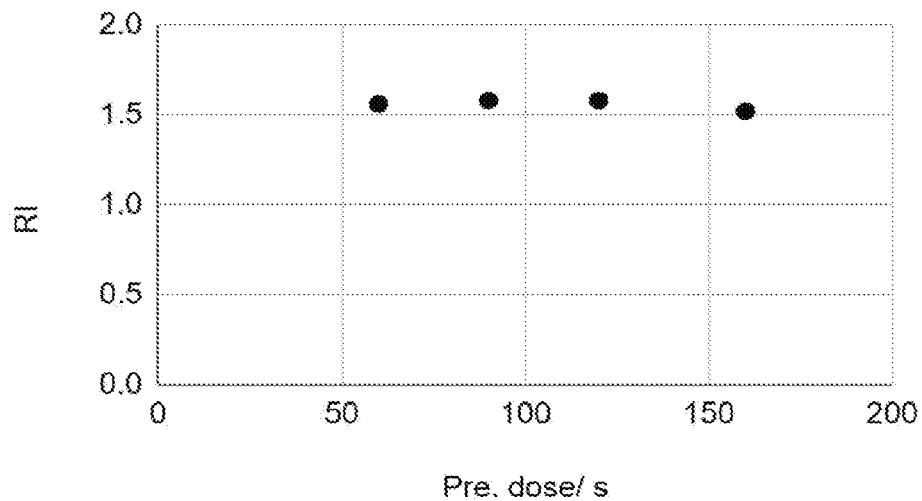
FIG. 13 is RI results of the deposited $Li_3PO_4$ film at 150° C. with 03.

The $Li_3PO_4$ film was deposited by ALD using LiN$(CH_2CH_2NMe_2)_2$, TMPO and $O_3$ at a temperature of 150° C. on a Si wafer using a fluidized bed reactor after 200 ALD cycles. The reactor temperature is 150° C. The pulse of LiN$(CH_2CH_2NMe_2)_2$ was 60 s and 160 s. The GPO (FIG. 12) reaches 1.6 Å after 60 s (about 1.4 cc) of LiN$(CH_2CH_2NMe_2)_2$, with a refractive index of 1.56 (FIG. 13). This $Li_3PO_4$ deposition process is thus very attractive for a number of battery applications, especially protective coating layers for Li-ion batteries and solid-state batteries.

Example 11: ALD of $Li_3PO_4$ Film Using LiN$(CH_2CH_2NMe_2)_2$ on Si Wafer at 135° C.

Figure 14:
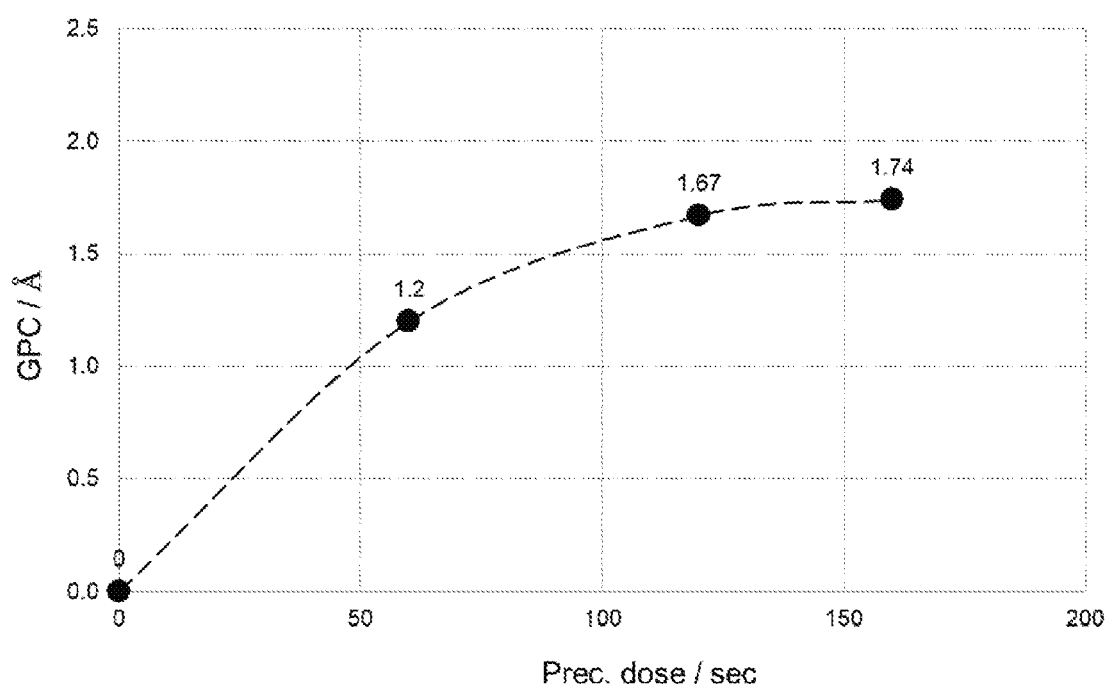
FIG. 14 is GPC results at 135° C. with $O_3$.
Figure 15:
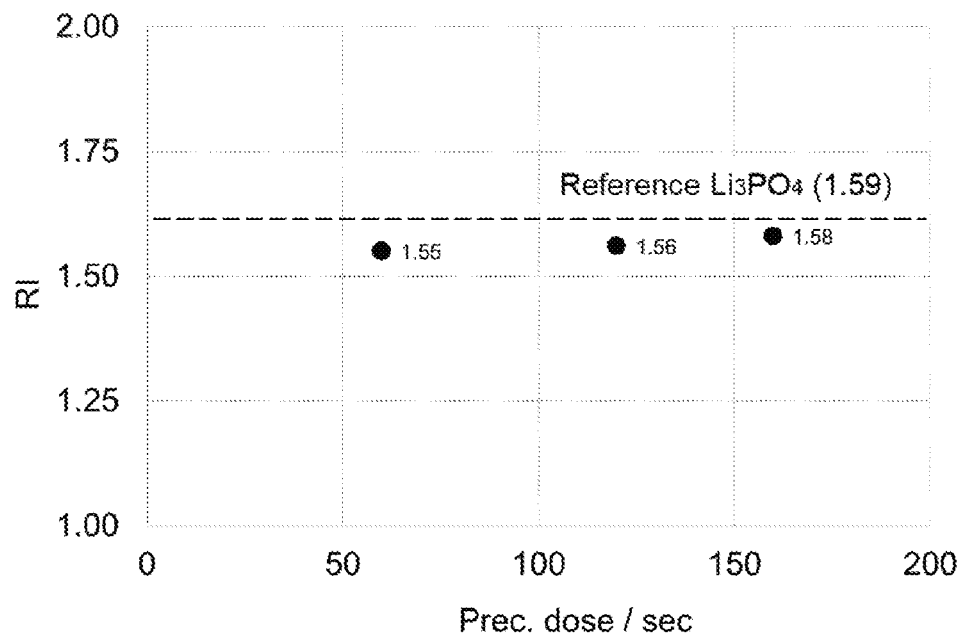
FIG. 15 is RI results of the deposited $Li_3PO_4$ film at 135° C. with 03.

The $Li_3PO_4$ film was deposited by ALD using LiN$(CH_2CH_2NMe_2)_2$, TMPO and $O_3$ at a temperature of 135° C. on a Si wafer using a fluidized bed reactor after 200 ALD cycles. The reactor temperature is 135° C. The pulse of LiN$(CH_2CH_2NMe_2)_2$ was 60 s and 160 s. FIG. 14 is GPC results at 135° C. FIG. 15 is RI results of the deposited $Li_3PO_4$ film at 135° C. At low temperature (e.g., T<150° C.), self-saturation of GPO is observed. As far as we know, there is no report concerning $Li_3PO_4$ ALD at T<150° C.

In addition, using a patterned Si wafer, under the same conditions, the films obtained on the patterned Si wafer (aspect ratio=6.25~18) had a good conformality of nearly 70%.

Example 12: ALD of $Li_3PO_4$ Film Using LiN$(CH_2CH_2NMe_2)_2$ on TiN Substrate at 135° C.

Figure 16:
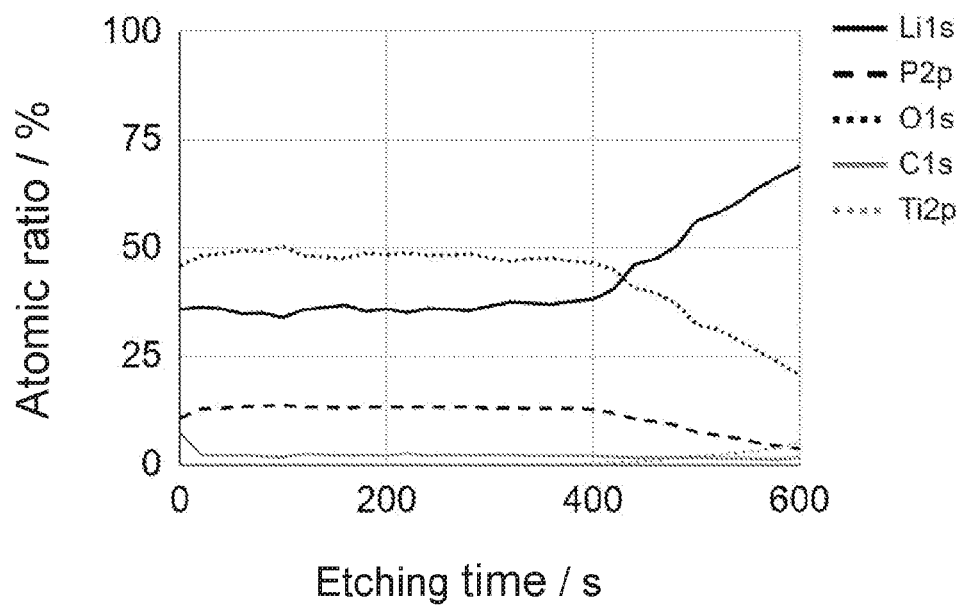
FIG. 16 is XPS results at 135° C. on TiN substrate.

The $Li_3PO_4$ film was deposited by ALD using LiN$(CH_2CH_2NMe_2)_2$, TMPO and $O_3$ at a temperature of 135° C. on a TiN wafer using a fluidized bed reaction after 200 ALD cycles. The reactor temperature is 135° C. $Li_3PO_4$ film growth is also observed on TiN substrate (FIG. 16).

Example 13: ALD of $Li_3PO_4$ Film at 135° C. without $O_3$

Figure 17:
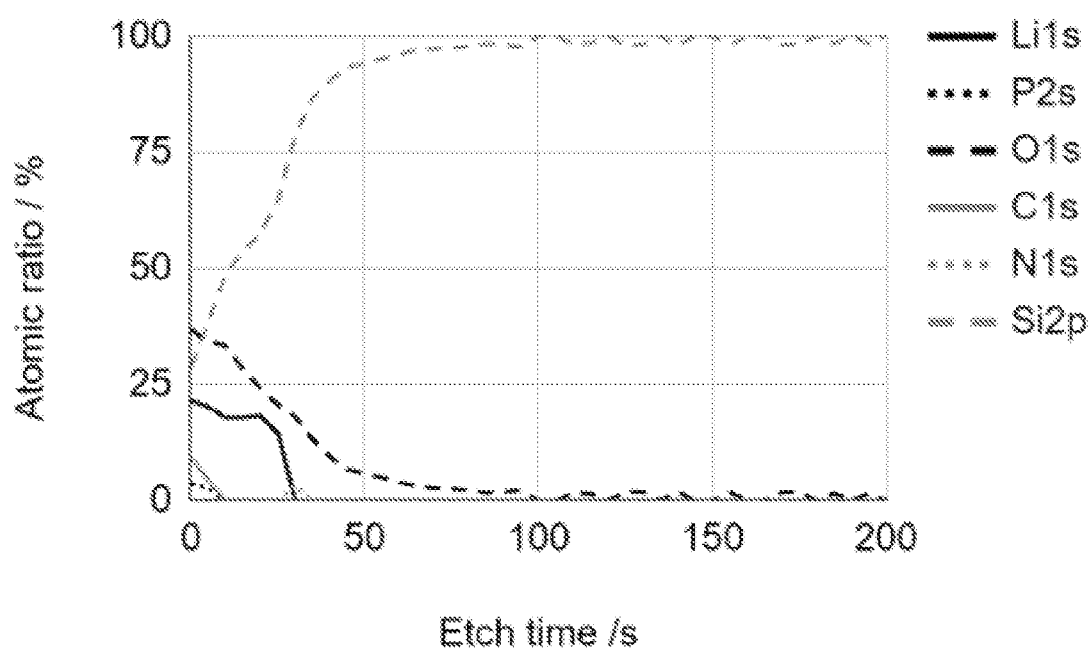
FIG. 17 is XPS results at 135° C. without $O_3$.

The $Li_3PO_4$ film was deposited by ALD using LiN$(CH_2CH_2NMe_2)_2$ and TMPO at a temperature of 135° C. on a Si wafer without $O_3$ using a fluidized bed reactor after 200 ALD cycles. The reactor temperature is 135° C. According to XPS analyses, a very thin film containing lithium, phosphorus, oxygen is observed. See FIG. 17. However, the GPO is very low (0.05%).

Prophetic Example 1: Expected Formation of the Li-Containing Films Using LiN$(CH_2CH_2NMe_2)_2$ Silicon or amorphous carbon substrates were introduced into an ALD or CVD reactor. Then, the substrates were heated under nitrogen atmosphere to the set point from 100 to 500° C. for each experiment. After the temperature reached to the set point, the LiN$(CH_2CH_2NMe_2)_2$ precursor, reactant and carrier gases were flowed into the reactor to deposit the films on the substrates. During this step, water vapor or oxygen as the reactant and nitrogen as the carrier gas were used, and the pressure was kept at 2 Torr. In the results, with water vapor as reactant, lithium oxide films would be deposited by ALD at 100° C., 120° C., 150° C., 175° C., 200° C. and 250° C. Lithium oxide films would also be obtained by CVD at 200° C., 300° C., 400° C. whereas lithium oxide films were deposited at 500° C. by CVD. On the other hand, with oxygen as reactant, lithium oxide films would be deposited by ALD at 100° C., 120° C., 150° C., 175° C., 200° C. and 250° C.

Prophetic Example 2: Expected Formation of the Li-Containing Films Using LiN$(CH_2CH_2NMe_2)_2$ Silicon or amorphous carbon substrates were introduced into an ALD or CVD reactor. Then, the substrates were heated under nitrogen atmosphere to the set point from 100 to 500° C. for each experiment. After the temperature reached to the set point, the LiN$(CH_2CH_2NMe_2)_2$ and NbCp(=NtBu)(NMe$_2$)$_2$ precursor mixture, reactant and carrier gases were flowed into the reactor to deposit the films on the substrates. During this step, water vapor or oxygen as the reactant and nitrogen as the carrier gas were used, and the pressure was kept at 2 Torr. In the results, with water vapor as reactant, lithium niobate films would be deposited by ALD at 100° C., 120° C., 150° C., 175° C., 200° C. and 250° C. Lithium niobate films would also be obtained by CVD at 200° C., 300° C., 400° C. whereas lithium niobate films were deposited at 500° C. by CVD. On the other hand, with oxygen as reactant, lithium niobate films would be deposited by ALD at 100° C., 120° C., 150° C., 175° C., 200° C. and 250° C.

Prophetic Example 3: Expected Formation of the Li-Containing Islets Using LiN$(CH_2CH_2NMe_2)_2$ Silicon or amorphous carbon substrates were introduced into an ALD or CVD reactor. Then, the substrates were heated under nitrogen atmosphere to the set point from 100 to 500° C. for each experiment. After the temperature reached to the set point, the LiN$(CH_2CH_2NMe_2)_2$ precursor, reactant and carrier gases were flowed into the reactor to deposit the islets on the substrates. During this step, water vapor or oxygen as the reactant and nitrogen as the carrier gas were used, and the pressure was kept at 2 Torr. In the results, with water vapor as reactant, lithium containing islets would be formed by ALD, using a very limited number of cycles, typically less than 10, at 100° C., 120° C., 150° C., 175° C., 200° C. and 250° C. Lithium containing islets would also be obtained by CVD at 200° C., 300° C., 400° C. when the CVD process duration is limited to few seconds to few minutes.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming a Li-containing film, islet or cluster on a substrate, the method comprising the steps of:
   introducing a silicon-free lithium precursor having a general formula $$[Li-NL^1L^2-D_x]_y \quad (I)$$

into a reactor containing the substrate disposed therein, wherein
   $L^1$ is a $C_1$-$C_{16}$ linear or branched chains, or of the form $(C_mH_n)$-$ER^1R^2$ or $(C_mH_n)$-$E'R^1$, wherein
   $C_mH_n$ is an alkyl chain and may be linear or branched groups;
   E represents B, N;
   E' represents a divalent element selected from O, S;
   m is an integer which value is 1 or an integer ranging from 1 to 8;
   n is an independent integer ranging from 2 to 16;
   $R^1$ is independent and selected from the group consisting of hydrogen, linear or branched groups, or linear or branched or substituted by other atoms or groups;
   $R^2$ is independent and selected from the group consisting of hydrogen, linear or branched groups, or linear or branched groups substituted by other atoms or groups;
   $L^2$ is of the form $(C_pH_q)$-$ER^3R^4$ or $(C_pH_q)$-$E'R^3$, wherein
   $C_pH_q$ is an alkyl chain and may be linear or branched groups;
   E represents B, N;
   E' represents a divalent element selected from O, S;
   p and q are independent integers ranging from 1 to 16;
   $R^3$ and $R^4$ are independent and selected from the group consisting of hydrogen, linear or branched alkyl groups, or linear or branched groups substituted by other atoms or groups;
   D is independently selected from monodentate, bidentate, tridentate, or polydentate neutral coordinating ligand system;
   x is an integer comprised between 0 and 4; and
   y represents the degree of association of the molecule and is comprised between 1 and 6; and
   depositing at least part of the silicon-free lithium precursor onto the substrate to form the Li-containing film, islet or cluster using a vapor deposition method.

2. The method of claim 1, wherein the silicon-free lithium precursor is selected from LiNMe(CH$_2$CH$_2$NMe$_2$), LiNMe(CH$_2$CH$_2$NMe$_2$)(1,2-diethoxyethane), LiNMe(CH$_2$CH$_2$NMe$_2$)(1,2-dimethoxyethane), LiNEt(CH$_2$CH$_2$NMe$_2$), LiNiPr(CH$_2$CH$_2$NMe$_2$), LiNtBu(CH$_2$CH$_2$NMe$_2$), LiNtBu(CH$_2$CH$_2$NEtMe), LiNtBu(CHMeCH$_2$NMe$_2$), LiNtBu(CH$_2$CHMeNMe$_2$), LiN(CH$_2$CH$_2$NMe$_2$)$_2$, LiN(CH$_2$CH$_2$NEt$_2$)$_2$, LiN(CH$_2$CH$_2$NiPr$_2$)$_2$, LiN(CH$_2$CH$_2$NEtMe)$_2$, LiN(CH$_2$CH$_2$CH$_2$NMe$_2$)$_2$, LiN(CHMeCH$_2$NMe$_2$)$_2$, LiN(CHMeCH$_2$NMe$_2$)(CH$_2$CH$_2$NMe$_2$), LiN(CH$_2$CHMeNMe$_2$)$_2$, LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$NMe$_2$)(CH$_2$CH$_2$CH$_2$NMe$_2$), LiNMe(CH$_2$CH$_2$OMe), LiNMe(CH$_2$CH$_2$OEt), LiNMe(CH$_2$CH$_2$O-iPr), LiNMe(CH$_2$CH$_2$O-tBu), LiNEt(CH$_2$CH$_2$OMe), LiNEt(CH$_2$CH$_2$OEt), LiNiPr(CH$_2$CH$_2$OMe), LiNtBu(CH$_2$CH$_2$OMe), LiN(CH$_2$CH$_2$OMe)$_2$, LiN(CH$_2$CH$_2$OEt)$_2$, LiN(CH$_2$CH$_2$O-iPr)$_2$, LiN(CH$_2$CH$_2$O-tBu)$_2$, LiN(CH$_2$CH$_2$NMe$_2$)(CH$_2$CH$_2$OMe), LiN(CH$_2$CH$_2$NMe$_2$)(CH$_2$CH$_2$OEt), LiN(CH$_2$CH$_2$NMe$_2$)(CH$_2$CH$_2$O-iPr), LiN(CH$_2$CH$_2$NMe$_2$)(CH$_2$CH$_2$O-tBu), or LiNMe(CH$_2$CH(OMe)$_2$).

3. The method of claim 1, wherein the silicon-free lithium precursor is selected from LiNtBu(CH$_2$CH$_2$NMe$_2$), LiNtBu(CH$_2$CH$_2$NEtMe), LiNtBu(CHMeCH$_2$NMe$_2$), LiNtBu(CH$_2$CHMeNMe$_2$), LiN(CH$_2$CH$_2$NEtMe)$_2$, LiN(CH$_2$CH$_2$OEt)$_2$, LiN(CH$_2$CH$_2$NMe$_2$)$_2$, LiN(CH$_2$CH$_2$CH$_2$NMe$_2$)$_2$, LiN(CH$_2$CH$_2$NMeEt)$_2$, LiN(CHMeCH$_2$NMe$_2$)(CH$_2$CH$_2$NMe$_2$), LiN(CH$_2$CHMeNMe$_2$)(CH$_2$CH$_2$NMe$_2$), LiN(CHEtCH$_2$NMe$_2$)(CH$_2$CH$_2$NMe$_2$), LiN(CH$_2$CHEtNMe$_2$)(CH$_2$CH$_2$NMe$_2$), LiN(CMe$_2$CH$_2$NMe$_2$)(CH$_2$CH$_2$NMe$_2$), LiN(CH$_2$CMe$_2$NMe$_2$)(CH$_2$CH$_2$NMe$_2$), LiN(CH$_2$CH$_2$N-iPr$_2$)$_2$, LiN(CH$_2$CH$_2$NMe$_2$)(CH$_2$CH$_2$CH$_2$NMe$_2$), LiN(CH$_2$CH$_2$OEt)$_2$, LiNMe(CH$_2$CH$_2$OEt), or LiNMe(CH$_2$CH(OMe)$_2$).

4. The method of claim 1, wherein the silicon-free lithium precursor is LiN(CH$_2$CH$_2$NMe$_2$)$_2$.

5. The method of claim 1, wherein the silicon-free lithium precursor is a monomer, a dimer, a trimer, or combinations thereof.

6. The method of claim 1, wherein the silicon-free lithium precursor is liquid below 150° C.

7. The method of claim 1, wherein the vapor deposition method is ALD, CVD, or a combination thereof.

8. The method of claim 1, further comprising the step of delivering into the reactor a co-reactant selected from O$_3$, O$_2$, H$_2$O, trimethylphosphate, an alkylphosphate, an alkylphosphimine, NO, N$_2$O, H$_2$O$_2$, O radicals, or combinations thereof.

9. The method of claim 8, wherein the co-reactant is O$_3$.

10. The method of claim 1, wherein the Li-containing film, islet or cluster is a film, islet or cluster of Li$_2$O, LiOH, Li$_2$S, Li$_3$N, LiF, lithium carbonate, lithium, aluminum fluorate, lithium aluminum oxide, lithium aluminum, lithium cobalt oxide, lithium titanate, lithium zirconate, lithium niobate, LiPON, lithium phosphate, lithium borate, lithium borophosphate, lithium niobate, or lithium zirconium oxides.

11. The method of claim 1, wherein the temperature within the reactor ranges from about 0° C. to about 600° C.

12. The method of claim 1, wherein D is a monodentate or a bidentate.

* * * * *